(12) United States Patent
Huang et al.

(10) Patent No.: US 12,237,288 B2
(45) Date of Patent: Feb. 25, 2025

(54) SEMICONDUCTOR DIE PACKAGE AND METHOD OF MANUFACTURE

(71) Applicant: Taiwan Semiconductor Manufacturing Co., Ltd., Hsinchu (TW)

(72) Inventors: Kuan-Yu Huang, Taipei (TW); Sung-Hui Huang, Dongshan Township (TW); Shang-Yun Hou, Jubei (TW); Shu Chia Hsu, Hsinchu (TW); Yu-Yun Huang, Hsinchu (TW); Wen-Yao Chang, Hsinchu (TW); Yu-Jen Cheng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/446,732

(22) Filed: Aug. 9, 2023

(65) Prior Publication Data

US 2023/0387058 A1    Nov. 30, 2023

Related U.S. Application Data

(62) Division of application No. 17/226,643, filed on Apr. 9, 2021.

(Continued)

(51) Int. Cl.
*H01L 23/00*    (2006.01)
*H01L 21/48*    (2006.01)
(Continued)

(52) U.S. Cl.
CPC .......... *H01L 24/17* (2013.01); *H01L 21/4853* (2013.01); *H01L 21/486* (2013.01);
(Continued)

(58) Field of Classification Search
None
See application file for complete search history.

(56) References Cited

U.S. PATENT DOCUMENTS 7,795,743 B2    9/2010    Kim et al.
8,993,380 B2    3/2015    Hou et al.
(Continued)

FOREIGN PATENT DOCUMENTS

CN    204927277 U    12/2015
CN    110034026 A    7/2019
(Continued)

*Primary Examiner* — Telly D Green
(74) *Attorney, Agent, or Firm* — Slater Matsil, LLP

(57) ABSTRACT

In an embodiment, an interposer has a first side, a first integrated circuit device attached to the first side of the interposer with a first set of conductive connectors, each of the first set of conductive connectors having a first height, a first die package attached to the first side of the interposer with a second set of conductive connectors, the second set of conductive connectors including a first conductive connector and a second conductive connector, the first conductive connector having a second height, the second conductive connector having a third height, the third height being different than the second height, a first dummy conductive connector being between the first side of the interposer and the first die package, an underfill disposed beneath the first integrated circuit device and the first die package, and an encapsulant disposed around the first integrated circuit device and the first die package.

20 Claims, 31 Drawing Sheets

Related U.S. Application Data

(60) Provisional application No. 63/066,366, filed on Aug. 17, 2020.

(51) Int. Cl.
| | |
|---|---|
| *H01L 21/56* | (2006.01) |
| *H01L 21/683* | (2006.01) |
| *H01L 23/31* | (2006.01) |
| *H01L 23/498* | (2006.01) |
| *H01L 25/00* | (2006.01) |
| *H01L 25/065* | (2023.01) |

(52) U.S. Cl.
CPC .......... *H01L 21/563* (2013.01); *H01L 21/565* (2013.01); *H01L 21/6835* (2013.01); *H01L 23/3128* (2013.01); *H01L 23/3135* (2013.01); *H01L 23/49827* (2013.01); *H01L 23/49838* (2013.01); *H01L 23/562* (2013.01); *H01L 24/08* (2013.01); *H01L 24/16* (2013.01); *H01L 24/80* (2013.01); *H01L 25/0655* (2013.01); *H01L 25/50* (2013.01); *H01L 2221/68331* (2013.01); *H01L 2224/08225* (2013.01); *H01L 2224/16227* (2013.01); *H01L 2224/17517* (2013.01); *H01L 2224/80895* (2013.01); *H01L 2224/80896* (2013.01); *H01L 2924/3511* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 11,088,115 B2 | 8/2021 | Byun et al. |
| 2014/0167254 A1 | 6/2014 | Yu et al. |
| 2019/0164860 A1 | 5/2019 | Lin et al. |
| 2019/0244947 A1 | 8/2019 | Yu et al. |
| 2019/0348386 A1 | 11/2019 | Huang et al. |
| 2020/0027806 A1 | 1/2020 | Lin et al. |
| 2020/0118915 A1 | 4/2020 | Yu et al. |
| 2020/0132432 A1 | 4/2020 | Son et al. |
| 2021/0066230 A1 | 3/2021 | Huang et al. |
| 2021/0358825 A1 | 11/2021 | Chen et al. |
| 2022/0285279 A1 | 9/2022 | Yang et al. |

FOREIGN PATENT DOCUMENTS

| | | | |
|---|---|---|---|
| CN | 110137151 A | | 8/2019 |
| CN | 111354690 A | | 6/2020 |
| KR | 20070073187 A | * | 7/2007 |
| KR | 20200069064 A | * | 6/2020 |
| TW | 202002190 A | | 1/2020 |
| TW | 202025412 A | | 7/2020 |

* cited by examiner

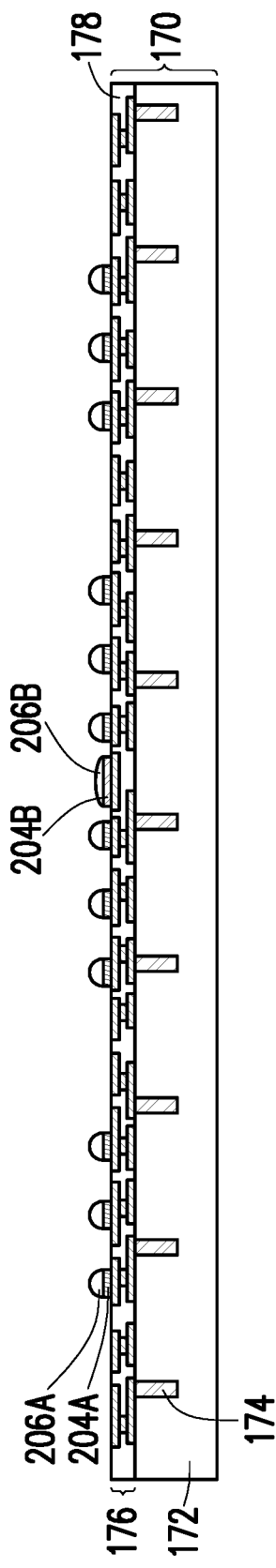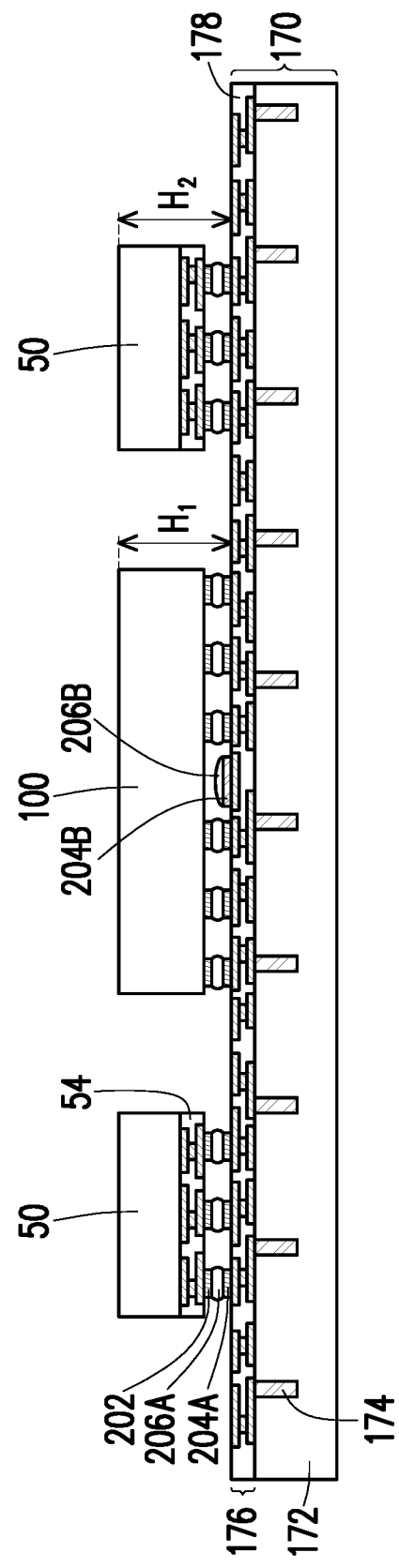
FIG. 11
FIG. 12A

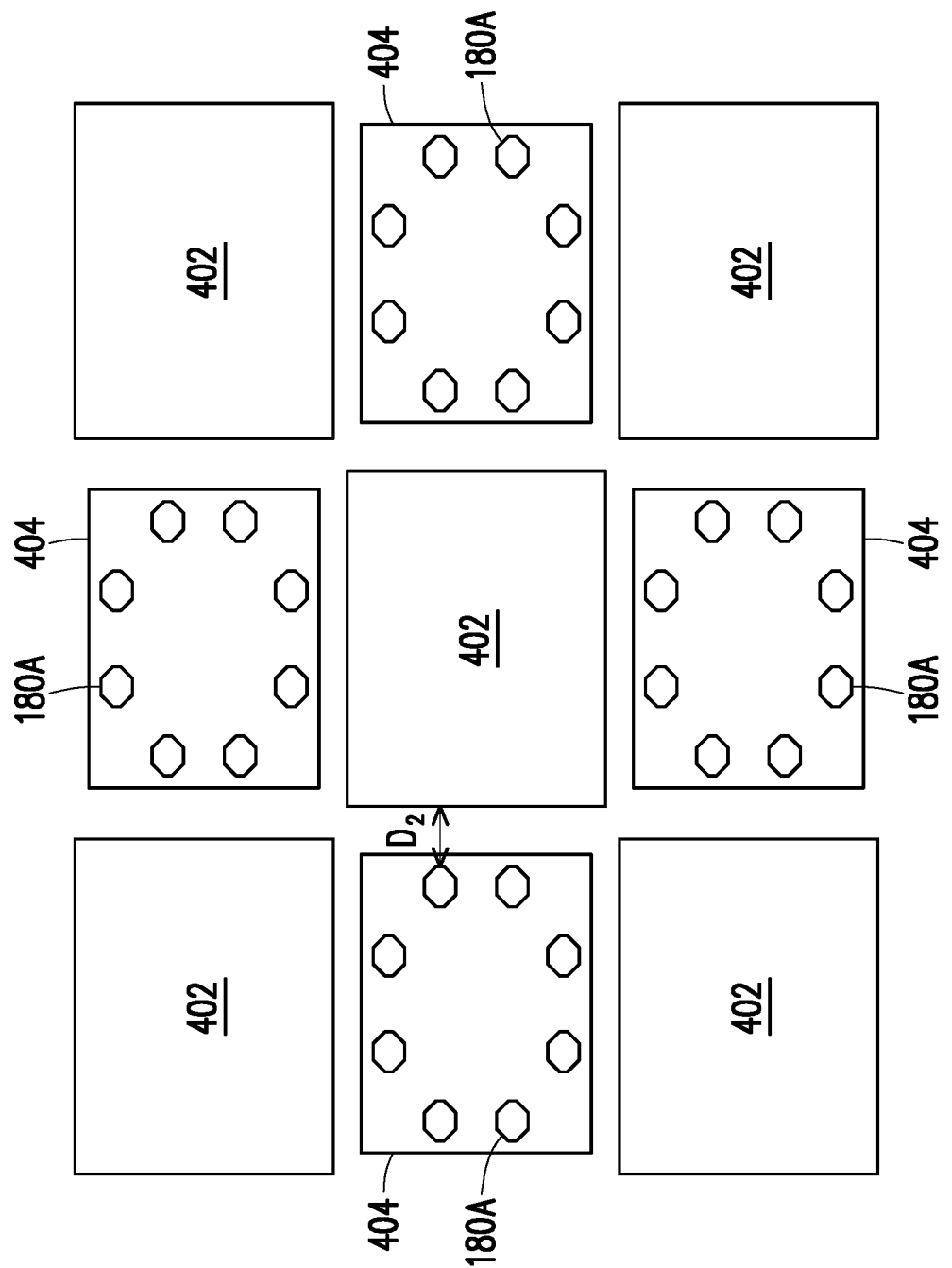

SEMICONDUCTOR DIE PACKAGE AND METHOD OF MANUFACTURE

PRIORITY CLAIM AND CROSS-REFERENCE

This application is a divisional of U.S. patent application Ser. No. 17/226,643, filed Apr. 9, 2021, entitled "Semiconductor Die Package and Method of Manufacture," which claims the benefit of U.S. Provisional Application No. 63/066,366, filed on Aug. 17, 2020, which applications are hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7 through 12B and 19 through 26 are cross-sectional and top views of intermediate steps during a process for forming semiconductor devices, in accordance with some embodiments.

FIGS. 13 through 18D are cross-sectional views and top views of configurations of active and dummy connectors in accordance with some embodiments.

DETAILED DESCRIPTION

Figure 1:
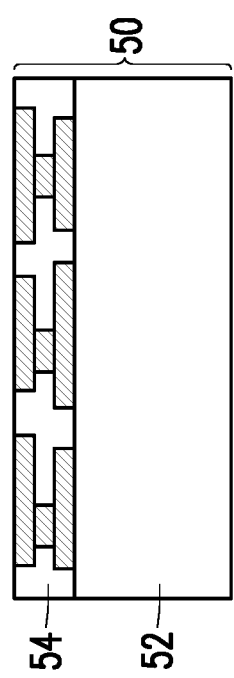
FIG. 1 illustrates a cross-sectional view of an integrated circuit die in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, integrated circuit devices are attached to a wafer using connectors with variable heights to account for any warpage of the integrated circuit dies and/or wafer. In some embodiments, the connectors are micro-bumps formed by a plating method. In those embodiments, the variable height micro-bumps are achieved by adjusting the pattern density of the micro-bumps in certain regions during the formation process by inserting dummy micro-bumps on one or both of the integrated circuit device and the wafer. For example, if a first region is desired to have shorter micro-bump heights as compared to a second region, the pattern density of the micro-bumps in the first region will be increased by inserting dummy micro-bumps in the first region. This formation of variable height connectors can prevent cold joints or broken connectors, and thus, can increase the reliability and yield of the devices.

Embodiments will now be described with respect to a system-on-a-chip ("SoC"). However, embodiments are not intended to be limited, and may be employed in a wide variety of embodiments. In some embodiments, a die package is formed that includes multiple dies bonded together. The dies may be bonded together using hybrid bonding, for example. The die package may include through substrate vias and/or through dielectric vias. A package may be formed incorporating the die package in addition to another semiconductor device, such as a memory die, I/O die, or the like. The die package and the semiconductor device may include conductive features of different sizes that are used to electrically connect to a single redistribution structure. By forming die packages of bonded dies and by incorporating die packages and semiconductor devices in the same package, the size of the package may be reduced, and the high-speed operation of the package may be improved.

FIG. 1 is a cross-sectional view of an integrated circuit device 50, in accordance with some embodiments. The integrated circuit device 50 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. The integrated circuit device 50 may be formed in a wafer, which may include different device regions that are singulated in subsequent steps to form a plurality of integrated circuit devices 50. The integrated circuit device 50 includes a substrate 52 and an interconnect structure 54.

The substrate 52 may include a bulk semiconductor substrate, semiconductor-on-insulator (SOI) substrate, multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices, such as transistors, capacitors, resistors, diodes, and the like, may be formed in and/or on an active surface (e.g., the surface facing upward) of the substrate 52.

An interconnect structure 54 having one or more dielectric layer(s) and respective metallization pattern(s) is formed on the active surface of the substrate 52. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like, by any suitable method known in the art, such as spin coating, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices, such as by using vias and/or traces, and may also contain various electrical devices, such as capacitors, resistors, inductors, or the like. The various devices and metallization patterns may be interconnected to perform one or more functions. The functions may include memory structures, processing structures, sensors, amplifiers, power distribution, input/output circuitry, or the like. Additionally, die connectors such as conductive pillars or contact pads, are formed in and/or on the interconnect structure 54 to provide an external electrical connection to the circuitry and devices. One of ordinary skill in the art will appreciate that the above examples are provided for illustrative purposes. Other circuitry may be used as appropriate for a given application.

In some embodiments, the integrated circuit device 50 is a stacked device that includes multiple substrates 52. For example, the integrated circuit device 50 may be a memory device such as a hybrid memory cube (HMC) module, a high bandwidth memory (HBM) module, or the like that includes multiple memory dies. In such embodiments, the integrated circuit device 50 includes multiple substrates 52 interconnected by vias. Each of the substrates 52 may (or may not) have a separate interconnect structure 54.

FIGS. 2 through 6 illustrate cross-sectional views of the formation of a die package 100 (see FIG. 6), in accordance with some embodiments. In some embodiments, the die package 100 is, for example, a system-on-a-chip (SoC) package, a system-on-an-integrated-circuit (SoIC) package, or the like. With respect now to FIG. 1, there is illustrated a semiconductor device 102. The semiconductor device 102 may be a semiconductor device such as a memory device, a logic device, a power device, combinations of these, or the like, that is design to work in conjunction with other devices within the die package 100. However, any suitable functionality may be utilized.

In an embodiment, the semiconductor device 102 includes a first substrate 104, first active devices (not separately illustrated), first metallization layers 106, a bond layer 108, and bond metal no within the bond layer 108. The first substrate 104 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices comprise a wide variety of active devices and passive devices such as transistors, capacitors, resistors, inductors and the like that may be used to generate the desired structural and functional requirements of the design for the semiconductor device 102. The first active devices may be formed using any suitable methods either within or else on the first substrate 104.

The first metallization layers 106 are formed over the first substrate 104 and the first active devices and are designed to connect the various active devices to form functional circuitry. In an embodiment, the first metallization layers 106 are formed of alternating layers of dielectric and conductive materials and may be formed through any suitable process (such as deposition, damascene, dual damascene, etc.). In an embodiment, there may be four layers of metallization separated from the first substrate 104 by at least one interlayer dielectric layer (ILD), but the precise number of first metallization layers 106 is dependent upon the design.

The bond layer 108 is deposited over the first metallization layers 106. The bond layer 108 may be used for fusion bonding (also referred to as oxide-to-oxide bonding or dielectric-to-dielectric bonding). In accordance with some embodiments, the bond layer 108 is formed of a silicon-containing dielectric material such as silicon oxide, silicon nitride, or the like. The bond layer 108 may be deposited using any suitable method, such as CVD, high-density plasma chemical vapor deposition (HDPCVD), PVD, atomic layer deposition (ALD), or the like. The bond layer 108 may be planarized, for example, using a chemical mechanical polish (CMP) process.

The bond metal no may be formed within the bond layer 108. In an embodiment, the bond metal no may be formed by first forming openings within the bond layer 108 by first applying a photoresist is applied over the top surface of the bond layer 108 and patterned. The patterned photoresist is then used as an etching mask to etch the bond layer 108 in order to form openings. The bond layer 108 may be etched by a suitable process such as dry etching (e.g., reactive ion etching (RIE) or neutral beam etching (NBE), etc.), wet etching, or the like. The bond metal no may also be referred to as "bond pads" or "metal pads."

Once the openings have been formed, the openings within the bond layer 108 are filled with the bond metal 110. In an embodiment the bond metal no may comprise a seed layer and a plate metal. The seed layer may be blanket deposited over top surfaces of the bond layer 108, and may comprise, for example, a copper layer. The seed layer may be deposited using processes such as sputtering, evaporation, or plasma-enhanced chemical vapor deposition (PECVD), or the like, depending upon the desired materials. The plate metal may be deposited over the seed layer through a plating process such as electrical or electro-less plating. The plate metal may comprise copper, a copper alloy, or the like. The plate metal may be a fill material, in some embodiments. A barrier layer (not separately illustrated) may be blanket deposited over top surfaces of the bond layer 108 before the seed layer. The barrier layer may comprise titanium, titanium nitride, tantalum, tantalum nitride, or the like.

Figure 2:
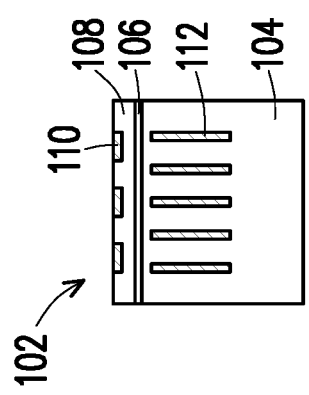
FIGS. 2 through 6 illustrate cross-sectional views of intermediate steps during a process for forming a die package, in accordance with some embodiments.

Still referring to FIG. 2, the semiconductor device 102 may include through substrate vias (TSVs) 112 that extend through the substrate 104 to facilitate transmission of electrical signals. In other embodiments, the semiconductor device 102 does not include TSVs 112. In an embodiment, the TSVs 112 may be formed by initially forming through substrate via (TSV) openings into the substrate 104. The TSV openings may be formed by applying and patterning a photoresist (not shown) to expose regions of the substrate 104, and then etching the exposed portions of the substrate 104 to the desired depth. The TSV openings may be formed so as to extend into the substrate 104 at least further than the active devices formed within and/or on the substrate 104, and may extend to a depth greater than the eventual desired height of the substrate 104. Accordingly, while the depth is dependent upon the overall designs, the depth may be between about 20 µm and about 200 µm from the active devices on the substrate 104, such as a depth of about 50 µm from the active devices on the substrate 104.

Once the TSV openings have been formed within the substrate 104, the TSV openings may be lined with a liner (not illustrated). The liner may be, e.g., an oxide formed from tetraethylorthosilicate (TEOS) or silicon nitride, although any suitable dielectric material may alternatively be used. The liner may be formed using a plasma enhanced chemical vapor deposition (PECVD) process, although other suitable processes, such as physical vapor deposition or a thermal process, may alternatively be used. Additionally, the liner may be formed to a thickness of between about 0.1 µm and about 5 µm, such as about 1 µm.

Once the liner has been formed along the sidewalls and bottom of the TSV openings, a barrier layer (also not independently illustrated) may be formed and the remainder of the TSV openings may be filled with first conductive material, forming the TSVs 112. The first conductive material may comprise copper, although other suitable materials such as aluminum, alloys, doped polysilicon, combinations thereof, and the like, may alternatively be utilized. The first conductive material may be formed by electroplating copper onto a seed layer (not shown), filling and overfilling the TSV openings. Once the TSV openings have been filled, excess liner, barrier layer, seed layer, and first conductive material outside of the TSV openings may be removed through a planarization process such as chemical mechanical polishing (CMP), although any suitable removal process may be used. In some embodiments, the TSVs 112 may be formed to have a width between about 0.5 µm and 10 µm, such as about 2 µm. In some embodiments, the TSVs 112 may be formed to have a pitch between about 1 µm and 40 µm, such as about 10 µm. However, any suitable dimensions may be utilized.

In some embodiments, multiple semiconductor devices 102 are formed on the same substrate 104, and then singulated to form individual semiconductor devices 102. The semiconductor devices 102 may be singulated using a sawing process, a laser process, an etching process, the like, or a combination thereof. After singulation, the semiconductor device 102 may have a thickness between about 30 um and about 200 µm, such as about 100 µm, in some embodiments. In some embodiments, the semiconductor device 102 may have an area between about 1 mm$^2$ and about 850 mm$^2$, such as about 30 mm$^2$. The semiconductor device 102 may have other dimensions than these. In some embodiments, known good dies (KGD) can be separated from defective dies prior to or after singulation.

Figure 3:
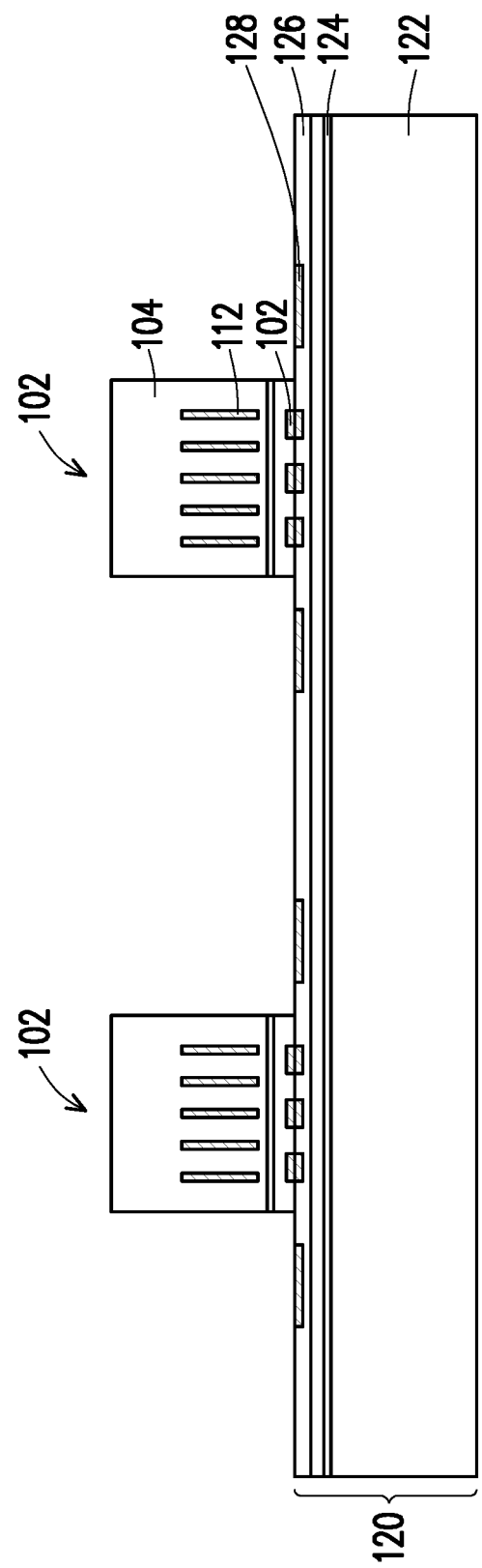

FIG. 3 illustrates a bonding of semiconductor devices 102 to a first wafer 120. In some embodiments, the first wafer 120 may be an application processor wafer in which semiconductor die (not separately illustrated) are formed to work in conjunction with the semiconductor device 102. However, any suitable functionality, such as additional memory or other functionality, may also be utilized. The first wafer 120 may comprise a second substrate 122 and second active devices (not separately illustrated in FIG. 3). In an embodiment, the second substrate 122 and the second active devices may be similar to the first substrate 104 and the first active devices described above with respect to FIG. 2. For example, the second substrate 122 may be a semiconductor substrate and the second active devices may be active and passives devices formed on or in the second substrate 122. However, any suitable substrate and active devices may be utilized.

The first wafer 120 may also comprise a second metallization layer 124, second bond layer 126, and second bond metal 128. In one embodiment, the second metallization layer 124, the second bond layer 126, and the second bond metal 128 may be similar to the first metallization layer 106, the first bond layer 108 and the first bond metal no. For example, the second bond metal 128 may be a metal placed into the second bond layer 126 after the second bond layer 126 has been formed.

In another embodiment, the second bond metal 128 and the second bond layer 126 are formed as part of the second metallization layer 124. For example, the second bond layer 126 may be formed as an initial dielectric layer overlying the active devices, while the second bond metal 128 may be formed within the second bond layer 126 and adjacent to the active devices, in what is known as a "viao" configuration. However, any suitable arrangement for the second bond metal 128 and the second bond layer 126 may be utilized.

After the second bond layer 126 and the second bond metal 128 have been formed, the semiconductor devices 102 may be bonded to the first wafer 120. In some embodiments, the semiconductor devices 102 may be bonded to the first wafer 120 using, e.g., a hybrid bonding process, in which the first bond layer 108 is bonded to the second bond layer 126 and the first bond metal no is bonded to the second bond metal 128. In some embodiments, the top surfaces of the first wafer 120 and the semiconductor devices 102 may first be activated utilizing, for example, a dry treatment, a wet treatment, a plasma treatment, exposure to an inert gas, exposure to H$_2$, exposure to N$_2$, exposure to O$_2$, the like, or combinations thereof. However, any suitable activation process may be utilized.

After the activation process, the first wafer 120 and the semiconductor devices 102 may be cleaned using, e.g., a chemical rinse, and then the semiconductor devices 102 are aligned and placed into physical contact with the first wafer 120. The semiconductor devices 102 may be placed on the first wafer 120 using a pick-and-place process, for example. The first wafer 120 and the semiconductor devices 102 are then subjected to thermal treatment and contact pressure to hybrid bond the first wafer 120 to the semiconductor devices 102. For example, the first wafer 120 and the semiconductor devices 102 may be subjected to a pressure of about 200 kPa or less, and a temperature between about 200° C. and about 400° C. to fuse the first bond layer 108 and the second bond layer 126. The first wafer 120 and the semiconductor devices 102 may then be subjected to a temperature at or above the eutectic point for material of the first bond metal no and the second bond metal 128, e.g., between about 150° C. and about 650° C., to fuse the metal bond pads. In this manner, fusion of the first wafer 120 and the semiconductor devices 102 forms a hybrid bonded device. In some embodiments, the bonded dies are baked, annealed, pressed, or otherwise treated to strengthen or finalize the bond.

Additionally, while the above description described the second bonding metal 128 as being within the second metallization layer 124 and the first bonding metal no being over the first metallization layer 106, this is intended to be illustrative and is not intended to be limiting. Rather, any suitable combination, including the first bonding metal no being located within the first metallization layer 106 (e.g., within the viao layer). In other embodiments, the first wafer 120 may be bonded to the semiconductor devices 102 by direct surface bonding, metal-to-metal bonding, or another bonding process. A direct surface bonding process creates a dielectric-to-dielectric bond or a substrate-to-substrate bond through a cleaning and/or surface activation process followed by applying pressure, heat and/or other bonding process steps to the joined surfaces. In some embodiments, the first wafer 120, the semiconductor devices 102 are bonded by metal-to-metal bonding that is achieved by fusing conductive elements. Any suitable bonding process may be utilized.

Figure 4:
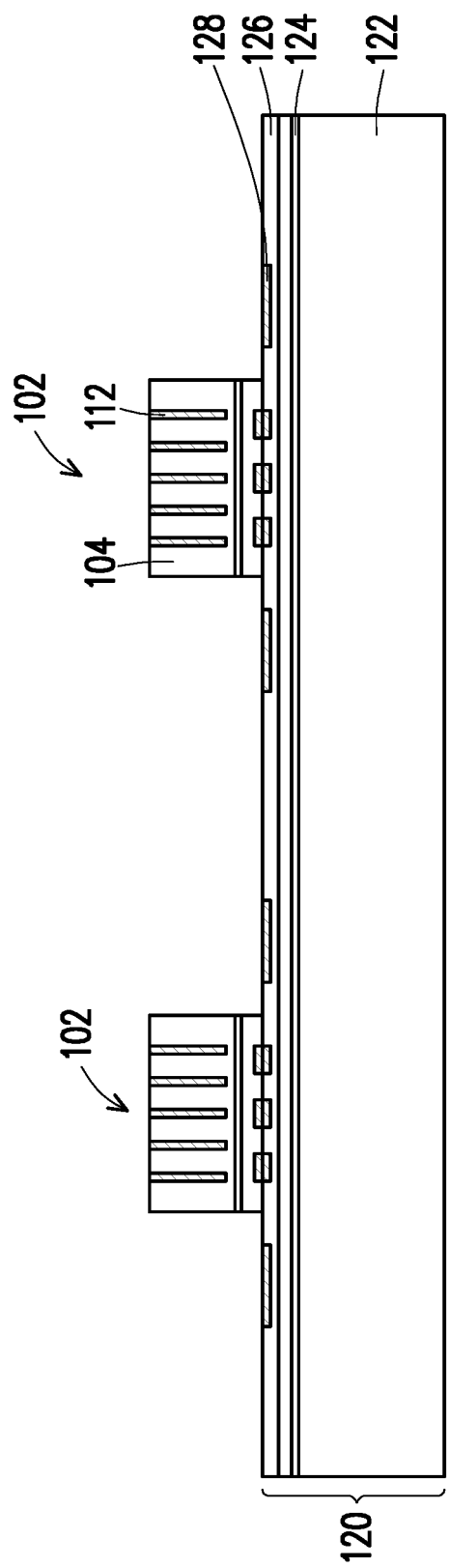

FIG. 4 illustrates a thinning of the semiconductor device 102 in order to expose the TSVs 112. In an embodiment, the thinning of the semiconductor devices 102 may be performed utilizing a planarization process such as a chemical mechanical planarization (CMP) process, in which etchants and abrasives are utilized along with a grinding platen in order to react and grind away material until a planar surface is formed and the TSVs 112 are exposed. However, any other suitable method of exposing the TSVs 112, such as a series of one or more etching processes, may also be utilized.

Figure 5:
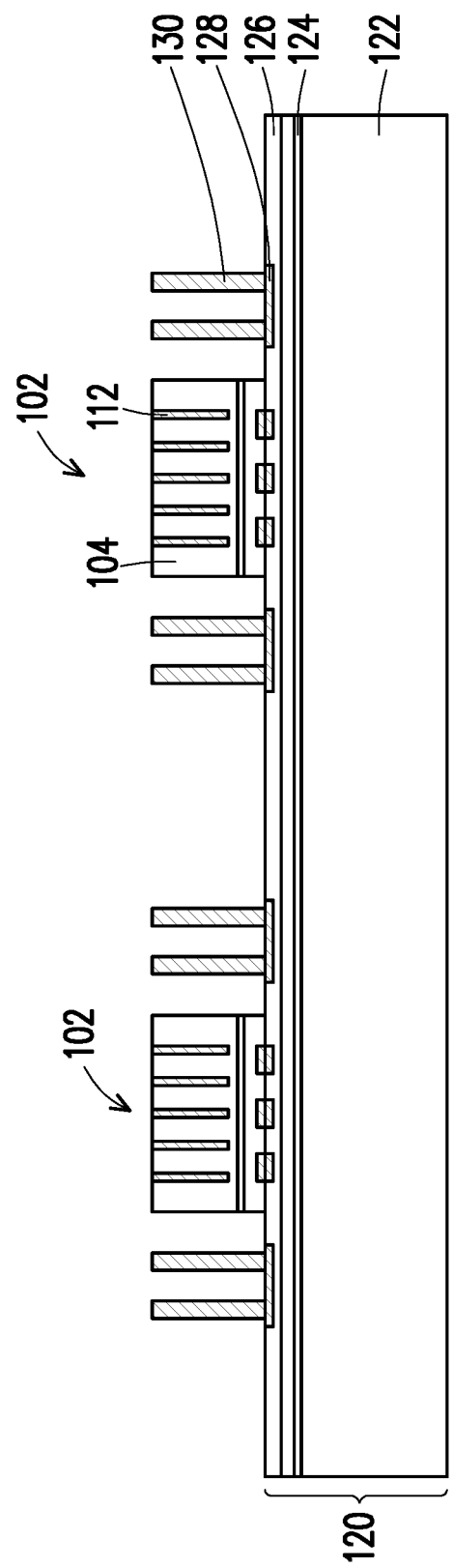

FIG. 5 illustrates a formation of through dielectric vias (TDVs) 130 onto the second bond metal 128. In other embodiments, TDVs 130 are not formed. In an embodiment the TDVs 130 may be formed by initially placing and patterning a photoresist (not separately illustrated in FIG. 5) over the second bond metal 128 (or over a separately placed seed layer if desired). In an embodiment, the pattern formed into the photoresist is a pattern for the TDVs 130. The TDVs 130 may be formed on different sides of the semiconductor devices 102. However, any suitable arrangement for the pattern of TDVs 130 may also be utilized. In some embodiments, the TDVs 130 may have a pitch greater than that of the TSVs 112.

Once the photoresist has been placed and patterned, the TDVs 130 may be formed within the photoresist. In an embodiment, the TDVs 130 comprise one or more conductive materials, such as copper, tungsten, other conductive metals, or the like, and may be formed, for example, by electroplating, electroless plating, or the like. After the conductive material of the TDVs 130 has been formed, the photoresist may be removed using a suitable removal process, such a plasma ashing process or a wet chemical strip. In some embodiments, the TDVs 130 may be formed to have a width between about 10 μm and about 200 μm, such as about 150 μm. Additionally, the TDVs 130 may be formed having a height between about 35 μm and about 250 μm, such as about 180 μm. However, any suitable dimensions may be utilized.

After forming the TDVs 130, the first substrate 104 of each semiconductor devices 102 may be recessed, in some embodiments. The first substrates 104 may be recessed using, e.g., one or more etching processes, such as a wet etching process or a dry etching process. However, any suitable method of recessing the first substrates 104 such that the TSVs 112 extend away from the first substrates 104 may be utilized. In this manner, the TSVs 112 may protrude from the first substrate 104 of die package 100 to facilitate external connection in subsequent processing steps.

Figure 6:
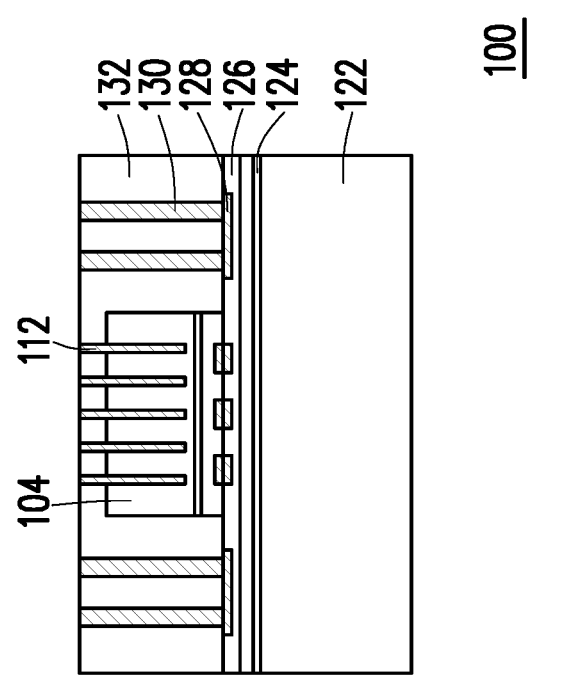

Turning to FIG. 6, a dielectric layer 132 is formed and a singulation process is performed, forming individual die packages 100. An individual die package 100 is shown in FIG. 6. After recessing the first substrates 104, a dielectric layer 132 may be formed over the semiconductor devices 102 and the TDVs 130. In some embodiments, the dielectric layer 132 may be a material such as a low temperature polyimide material, although any other suitable dielectric, such as PBO, another polymer, a resin, an epoxy, the like, or combinations thereof may also be utilized. In some cases, the dielectric layer 132 may be cured.

After forming the dielectric layer 132, the first wafer 120 may be thinned and then a singulation process performed to singulate individual die package 100. In an embodiment, a back-side of the first wafer 120 may be thinned utilizing, for example, a planarization process such as a CMP process or a grinding process. However, any suitable process for thinning the first wafer 120, such as a series of one or more etches or a combination of polishing and etching, may also be utilized.

In some embodiments, the dielectric layer 132 may be formed to cover the TDVs 130 and TSVs 112 and may subsequently be recessed to expose the TDVs 130 and the TSVs 112. The dielectric layer 132 may be recessed using, e.g., a planarization process such as a CMP process or a grinding process, or one or more etching processes, such as a wet etching process or a dry etching process. However, any suitable method of recessing the dielectric layer 132 may be utilized. In this manner, the TDVs 130 and the TSVs 112 are exposed to facilitate external connection in subsequent processing steps.

In some embodiments, after the formation of the dielectric layer 132 (and after the optional recessing step), surfaces of the dielectric layer 132, the TDVs 130, and the TSVs 112 are coplanar within process variations. The first wafer 120 may be singulated using a sawing process, a laser process, an etching process, the like, or a combination thereof.

FIGS. 7 through 12B and 19 through 26 are cross-sectional and top views of intermediate steps during a process for forming semiconductor devices, in accordance with some embodiments. FIGS. 13 through 18D are cross-sectional views and top views of configurations of active and dummy connectors in accordance with various embodiments. In FIGS. 7 through 12A and 19-25, a device package 200 is formed by bonding various integrated circuit devices 50 and die packages 100 to the front side of the interposer 170. In some embodiments, the device package 200 is a chip-on-wafer (CoW) package, although it should be appreciated that embodiments may be applied to other three-dimensional integrated circuit (3DIC) packages. In FIG. 25, a device package 400 is formed by mounting the device package 200 to a package substrate. In an embodiment, the device package 400 is a chip-on-wafer-on-substrate (CoWoS®) package, although it should be appreciated that embodiments may be applied to other 3DIC packages.

Figure 7:
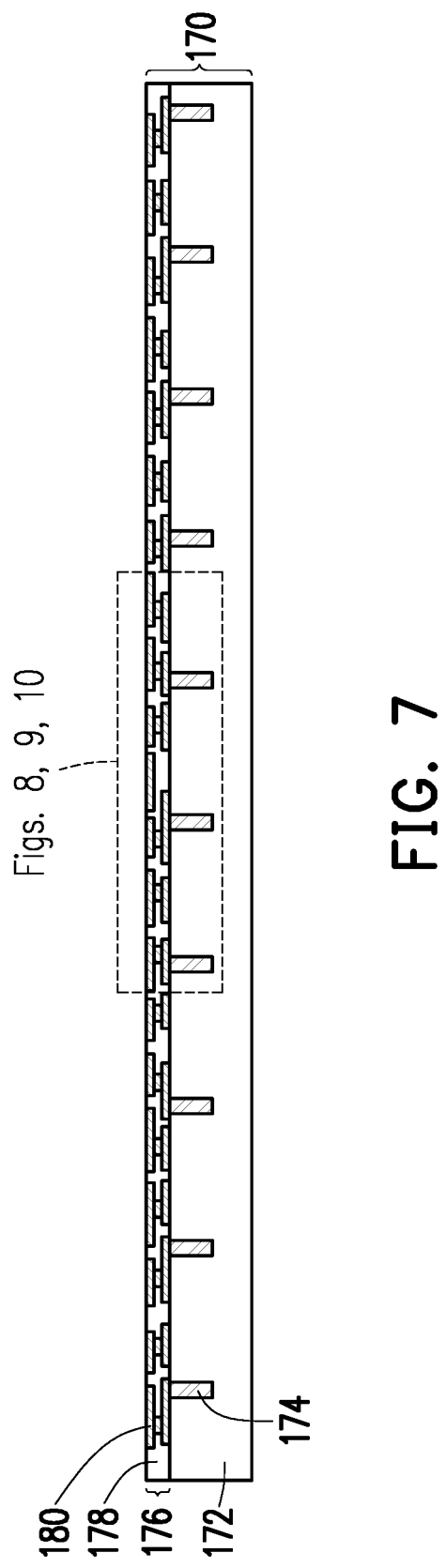

FIG. 7 is a cross-sectional view of an interposer 170, in accordance with some embodiments. Although only one interposer 170 is shown, it should be appreciated that the interposer 170 may be formed in a wafer having multiple device regions, with each device region used to form one interposer 170. The interposer 170 includes a substrate 172, through vias 174, and an interconnect structure 176.

The substrate 172 may be a bulk semiconductor substrate, SOI substrate, multi-layered semiconductor substrate, or the like. The semiconductor material of the substrate 172 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 172 may be doped or undoped. Active devices such as transistors may (or may not) be in and/or on a front surface (e.g., the surface facing upward) of the substrate 172. Passive devices such as capacitors, resistors, diodes, or the like may (or may not) be in and/or on the front surface of the substrate 172.

The through vias 174 are formed to extend from the front surface of the substrate 172 into substrate 172. The through vias 174 are also sometimes referred to as through-substrate vias or through-silicon vias (TSVs) when the substrate 172 is a silicon substrate. The through vias 174 may be formed by forming recesses in the substrate 172 by, for example, etching, milling, laser techniques, a combination thereof, and/or the like. A thin dielectric material may be formed in the recesses, such as by using an oxidation technique. A thin barrier layer may be conformally deposited over the front side of the substrate 172 and in the openings, such as by CVD, atomic layer deposition (ALD), physical vapor deposition (PVD), thermal oxidation, combinations thereof, and/or the like. The barrier layer may be formed from a nitride or an oxynitride, such as titanium nitride, titanium oxynitride, tantalum nitride, tantalum oxynitride, tungsten nitride, combinations thereof, and/or the like. A conductive material may be deposited over the thin barrier layer and in the openings. The conductive material may be formed by an electro-chemical plating process, CVD, ALD, PVD, combinations thereof, and/or the like. Examples of conductive materials are copper, tungsten, aluminum, silver, gold, combinations thereof, and/or the like. Excess conductive material and barrier layer is removed from the front side of the substrate 172 by, for example, a chemical-mechanical polish (CMP). Thus, the through vias 174 may include a conductive material, with a thin barrier layer between the conductive material and the substrate 172.

The interconnect structure 176 is formed over the front surface of the substrate 172, and is used to electrically connect the devices of the substrate 172 (if any) and/or the through vias 174 together and/or to external devices. The interconnect structure 176 may include one or more dielectric layer(s) 178 and respective metallization pattern(s) 180 in the dielectric layer(s). The metallization patterns 180 may include vias and/or traces to interconnect any devices and/or through vias 174 together and/or to an external device. The dielectric layers 178 may be formed from silicon oxide, silicon nitride, silicon carbide, silicon oxynitride, low-K dielectric material, such as PSG, BPSG, FSG, $SiO_xC_y$, Spin-On-Glass, Spin-On-Polymers, silicon carbon material, compounds thereof, composites thereof, combinations thereof, or the like. The dielectric layers 178 may be deposited by any suitable method, such as spin coating, CVD, PECVD, HDP-CVD, or the like. A metallization pattern 180 may be formed in the dielectric layer 178, for example, by using photolithography techniques to deposit and pattern a photoresist material on the dielectric layer to expose portions of the dielectric layer that are to become the metallization pattern. An etch process, such as an anisotropic dry etch process, may be used to create recesses and/or openings in the dielectric layer 178 corresponding to the exposed portions of the dielectric layer 178. The recesses and/or openings may be lined with a diffusion barrier layer and filled with a conductive material. The diffusion barrier layer may be formed from one or more layers of TaN, Ta, TiN, Ti, CoW, or the like, deposited by ALD or the like, and the conductive material may be formed from copper, aluminum, tungsten, silver, combinations thereof, or the like, and may be deposited by CVD, PVD, or the like. Any excessive diffusion barrier layer and/or conductive material on the dielectric layer 178 may be removed, such as by using a CMP.

Figure 8:
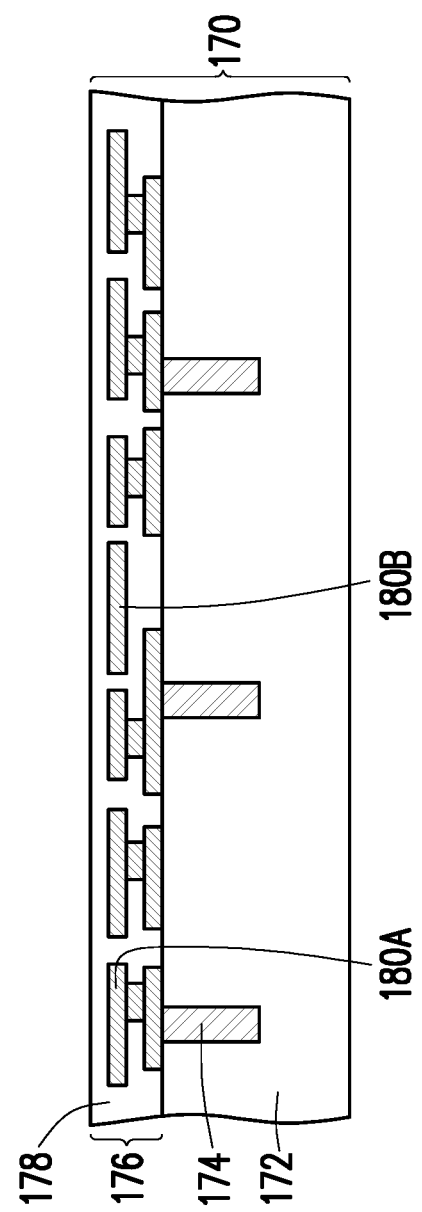
Figure 9:
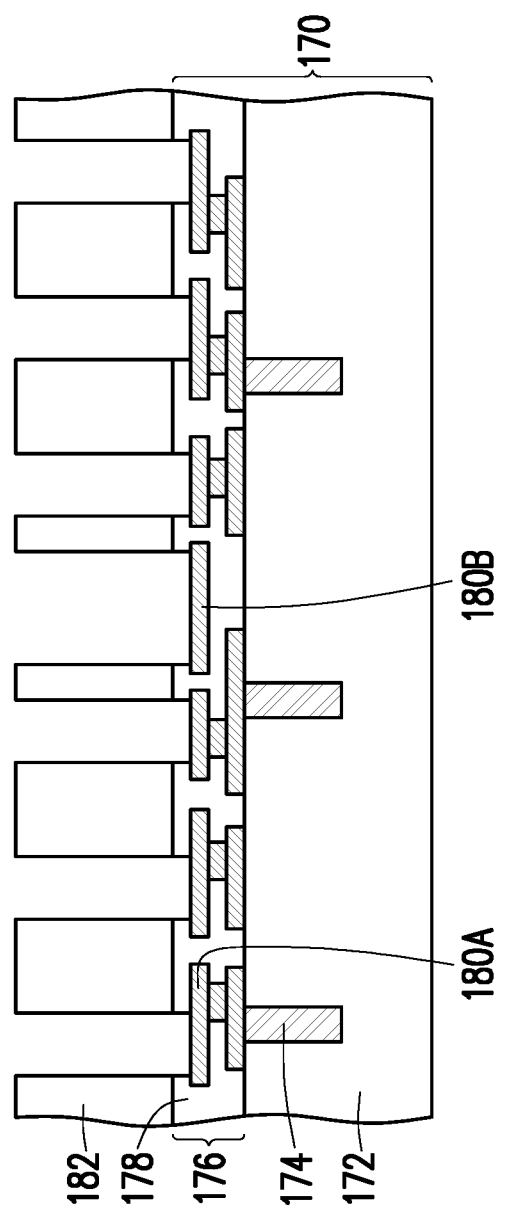
Figure 10:
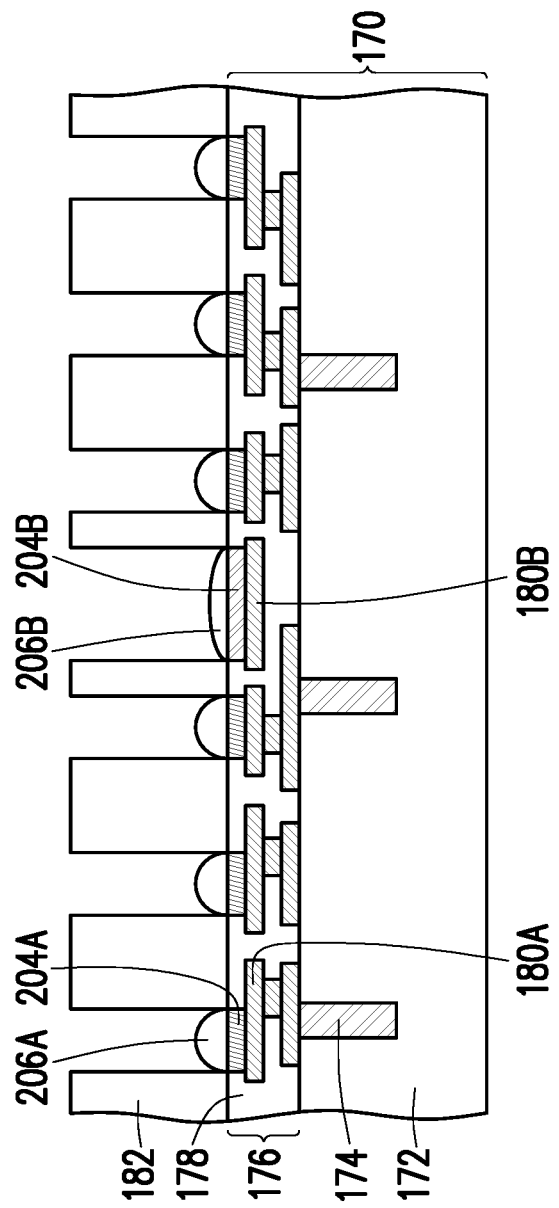

FIGS. 8 through 10 illustrate the formation of electrical connectors on the interconnect 176 in a detailed view of a portion of FIG. 7. In FIG. 8, the dielectric layer 178 is illustrated to extend over and cover the topmost metallization pattern 180. However, in some embodiments, top surfaces of the dielectric layer 178 and the topmost metallization pattern 180 are coplanar within process variations. In FIG. 8, metallization pattern 180A is electrically coupled to other metallization patterns in the interconnect structure and may subsequently be electrically coupled to integrated circuit devices 50 and/or die packages 100 (can also be referred to as active metallization pattern 180A). Metallization pattern 180B is electrically isolated (can also be referred to as dummy metallization pattern 180B) from other metallization patterns in the interconnect structure and subsequently will not be electrically coupled to integrated circuit devices 50 and/or die packages 100. In some embodiments, the topmost metallization patterns 180 (which the illustrated 180A and 180B are a part of) may be referred to as pads 180 or underbump metallizations (UBMs) 180.

Although a single dummy pad 180B is illustrated, in some embodiments, more dummy pads 180B may be included as needed. For example, a single interconnect structure 176 may include hundreds, thousands, or more dummy pads 180B depending on the design of the interposer 170 and the overall package structure. As discussed in more detail below, the dummy pads 180B are placed in specific areas/regions of the interconnect 176 to increase the pattern density of the pads 180 and forming conductive bumps 204 in those specific areas/regions such that the difference in pattern density in the pads 180 and forming conductive bumps 204 changes the rate of formation for conductive bumps 204 in those specific areas/regions. For example, the conductive bumps 204 may be formed by a plating process, such as electroplating, and the pattern density of the pads 180 and conductive bumps 204 affects and changes the plating rate. Specifically, areas/regions with a higher pattern density of pads 180 and conductive bumps 204 has a slower plating rate, and areas/regions with a lower pattern density of pads 180 and conductive bumps 204 has a higher plating rate. As discussed further below, this difference in plating rate may be used to adjust the height of the conductive bumps 204 in different areas/regions of the interposer 170 to deal with warpage of the interposer 170 and/or the integrated circuit devices 50 and die packages 100 that are subsequently attached to the interposer 170.

In FIG. 9, a photoresist material 182 is deposited and patterned on the interconnect structure 176 to expose portions of the dielectric layer 178 where a subsequent patterning process will be used to pattern the exposed dielectric layer 178. Further in FIG. 9, an etch process, such as an anisotropic dry etch process, may be used to create recesses and/or openings in the dielectric layer 178 to expose portions of the pads 180 corresponding to the exposed portions of the dielectric layer 178.

In FIG. 10, electrical connectors that include conductive bumps 204 and conductive connectors 206 are formed on the exposed pads 180. Conductive bumps 204A and conductive connectors 206A (can also be referred to as active conductive bumps 204A and active conductive connectors 206A) are electrically coupled to the active metallization pattern 180A and may subsequently be electrically coupled to integrated circuit devices 50 and/or die packages 100. Conductive bumps 204B and conductive connectors 206B (can also be referred to as dummy conductive bumps 204B and dummy conductive connectors 206B) are electrically coupled to the dummy metallization pattern 180B and which is electrically isolated from other metallization patterns in the interconnect structure and subsequently will not be electrically coupled to integrated circuit devices 50 and/or die packages 100.

The conductive bumps 204 are formed from a conductive material such as copper, aluminum, gold, nickel, palladium, the like, or combinations thereof and may be formed by sputtering, printing, electro plating, electroless plating, CVD, or the like. The conductive bumps 204 may be solder-free and have substantially vertical sidewalls, and may be referred to as pillars. The conductive bumps 204 are electrically and physically connected to the interconnect structure 176. The active conductive connectors 206A bond the conductive bumps 204 to connectors on other devices such as the subsequently bonded devices 100 and 50 (see FIGS. 12A-B). The dummy conductive connectors 206B do not bond the conductive bumps 204 to any other devices (see FIGS. 12A-B). The conductive connectors 206 may be formed from a conductive material such as solder and may be referred to as a solder cap. The conductive connectors 206 may be formed by initially forming a layer of solder on the conductive bumps 204 through methods such as evaporation, electroplating, printing, solder transfer, ball placement, or the like. Once the layer of solder has been formed, a reflow process may be performed in order to shape the conductive connectors 206 into desired bump shapes. The conductive bumps 204 and the conductive connectors 206 together form micro-bumps.

FIG. 11 illustrates the structure in FIG. 7 with the conductive bumps 204 and conductive connectors 206 formed on the pads 180 as discussed in the detailed view of FIGS. 8 through 10.

In FIG. 12A, multiple integrated circuit devices 50 and one or more die packages 100 are attached to the interposer 170. The multiple integrated circuit devices 50 and one or more die packages 100 may be attached to the interconnect structure 176 using, for example, a pick-and-place tool.

The various integrated circuit devices 50 may include multiple devices with different functions. The interconnect structures 54 and 176 are connected to physically and electrically connect the integrated circuit devices 50 and the interposer 170. The integrated circuit devices 50 may each have a single function (e.g., a logic device, memory die, etc.), or may have multiple functions (e.g., a SoC). In an embodiment, the integrated circuit devices 50 are memory devices such as HBM modules. The integrated circuit devices 50 may also include logic devices such as CPUs.

The die package 100 (an exemplary die package 100 is illustrated in FIG. 6) includes multiple devices. The TDVs 130 and the through vias 112 of the die package 100 are connected to the conductive connectors 206 to physically and electrically connect the die package 100 and the interposer 170.

Back surfaces of the one or more die packages 100 are disposed a height $H_1$ from the interconnect structure 176, and back surfaces of the integrated circuit devices 50 are disposed a height $H_2$ from the interconnect structure 176. The heights $H_1$ and $H_2$ may be the same, or may be different. In some embodiments, the height $H_1$ is in the range of from about 50 μm to about 800 μm, and the height $H_2$ is in the range of from about 50 μm to about 800 μm.

Figure 12B:
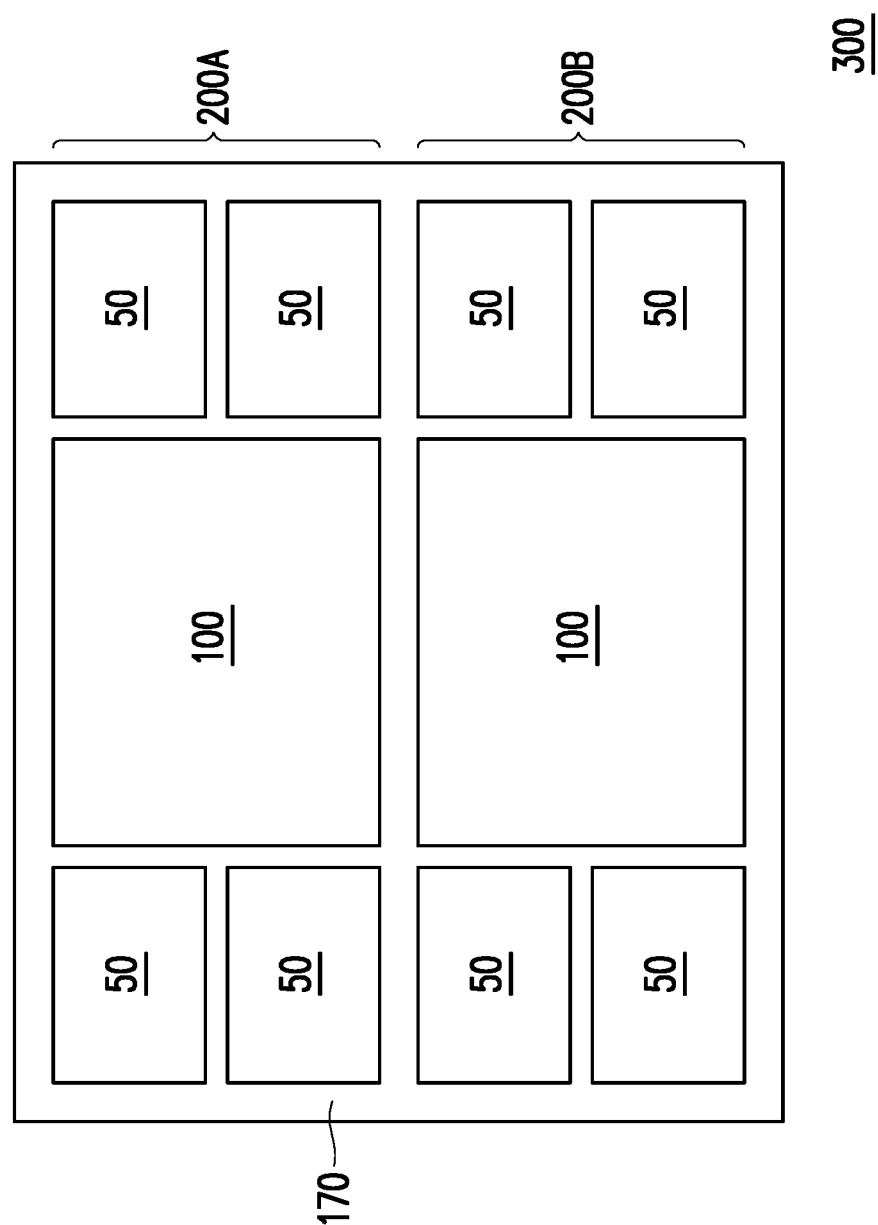

In embodiments where the interposer 170 is formed in a wafer, the multiple integrated circuit devices 50 and one or more die packages 100 may be attached in different device regions of the wafer, which will be singulated in subsequent steps to form multiple device packages 200. FIG. 12B is an exemplary top views of the structure of FIG. 12A, showing regions 200A and 200B. The regions 200A and 200B each containing multiple devices 50 and a single die package 100. In some embodiments, such as the embodiment of FIG. 12B, the integrated circuit devices 50 are symmetrically laid out adjacent the die package 100. In some embodiments, the integrated circuit devices 50 are asymmetrically laid out adjacent the die package 100. An asymmetric layout may allow the integrated circuit devices 50 to be located closer to input/output (I/O) connecting regions of the die package 100.

In the embodiment shown, the multiple integrated circuit devices 50 and one or more die packages 100 are attached to the interconnect structure 176 with connections that include conductive bumps 202 (can also be referred to as active conductive bumps 202), active conductive bumps 204A, and conductive connectors 206. The active conductive bumps 202 are electrically and physically connected to the interconnect structure 54, and the active conductive bumps 204A are electrically and physically connected to the interconnect structure 176. The conductive connectors 206 bond the active conductive bumps 202 and 204A.

The dummy conductive bumps 204B and dummy conductive connectors 206B on the interconnect structure 176 are not connected to the multiple integrated circuit devices 50 or the one or more die packages 100 that are bonded to the interconnect structure. In the illustrated embodiment, there are no corresponding active conductive bumps 202 to be bonded to the dummy conductive bumps 204B and dummy conductive connectors 206B. In some embodiments, the multiple integrated circuit devices 50 and one or more die packages 100 can also include dummy conductive bumps 202 that can be bonded to the dummy conductive bumps 204B and dummy conductive connectors 206B.

Figure 13:
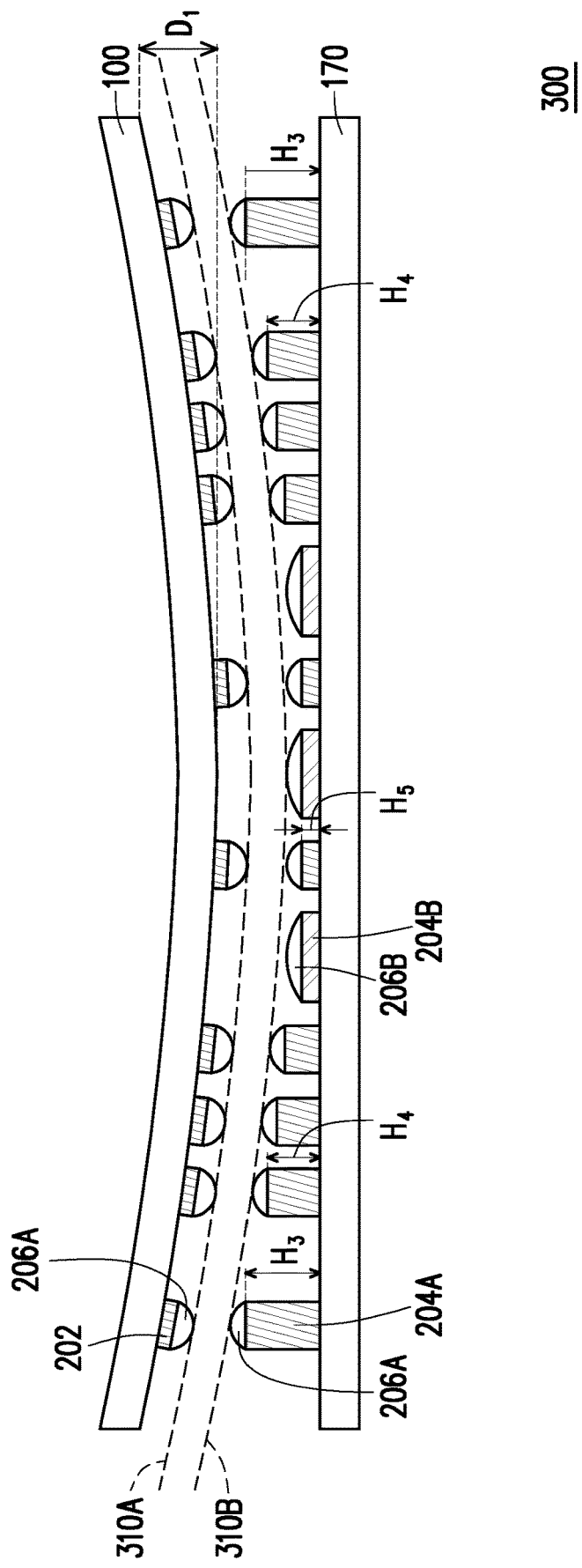
Figure 14:
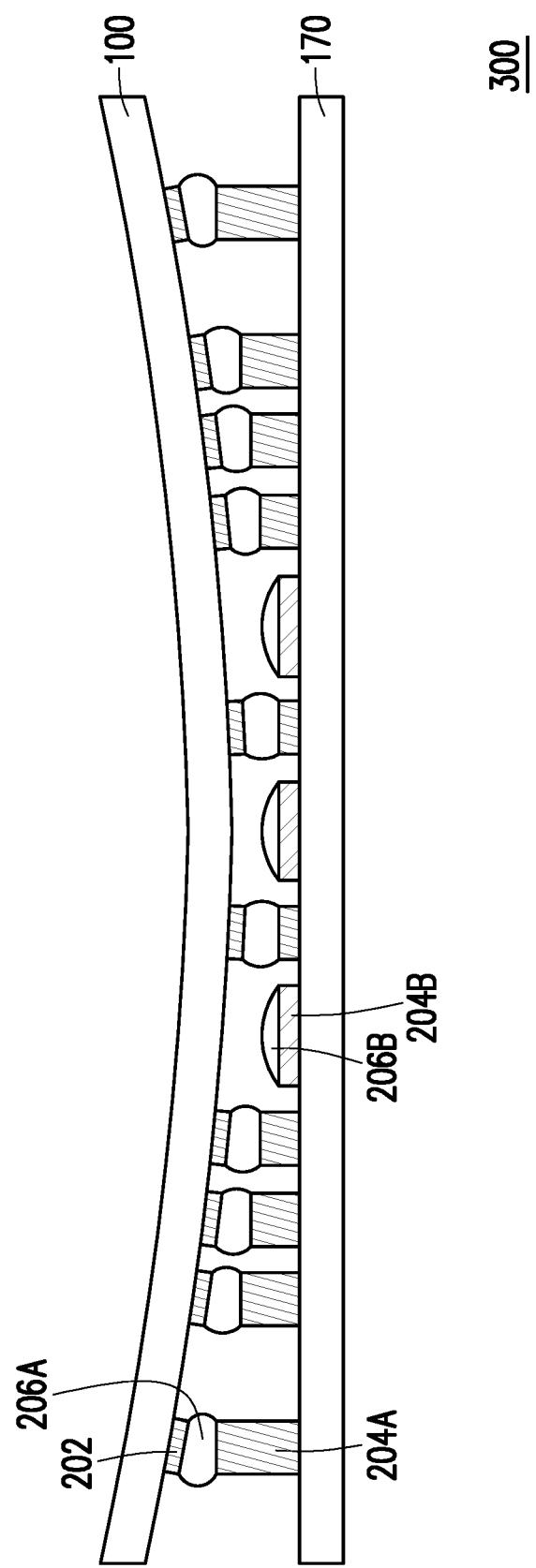

FIGS. 13 and 14 illustrate simplified versions of a portion of a package 300 before and after bonding the die package 100 and the interposer 170. In FIG. 13, the die package 100 and a portion of the interposer 170 are shown before being bonded together. As illustrated in FIG. 13, the die package 100 is warped or curved such that the bonding surfaces of the active conductive connectors 206A formed on the active conductive bumps 202 on die package 100 follow a curved profile 310A. In this example, the die package 100 is curved such that the edges extend higher than a central region (sometimes referred to as a smiling profile). In some embodiments, the die package is curved such that the edges extend lower than the central region (sometimes referred to as a frowning profile) (see, e.g., FIG. 17). The curved profile 310A of the bonding surfaces of the active conductive connectors 206A formed on the active conductive bumps 202 on die package 100 can cause problems such as, cold joints or broken connectors, if the bonding surfaces of the active conductive connectors 206A formed on the active conductive bumps 204A on the interposer 170 do not have a similar curved profile.

As discussed above and in more detail below, the dummy conductive bumps 204B are placed in specific areas/regions of the interposer 170 to increase the pattern density of the conductive bumps 204 in those specific areas/regions such that the difference in pattern density in the conductive bumps 204 changes the rate of formation for conductive bumps 204 in those specific areas/regions. This difference in formation rate may be used to adjust the height of the conductive bumps 204 in different areas/regions of the interposer 170 to deal with warpage of the interposer 170 and/or the integrated circuit devices 50 and die packages 100 that are subsequently attached to the interposer 170. Thus, as illustrated in FIG. 13, the bonding surfaces of the active conductive connectors 206A formed on the active conductive bumps 204A on the interposer 170 follow a curved profile 310B which is similar to the curved profile 310A of the die package 100. In the illustrated embodiment of FIG. 13, the active conductive bumps 204A on the interposer 170 are formed to be shorter in the central region of the interposer 170 and to get taller moving away from the central region. For example, outer active conductive bumps 204A may be formed to a height $H_3$, central active conductive bumps 204A may be formed to a height $H_5$, and active conductive bumps 204A between the outer and central bumps may be formed to a height $H_4$. In some embodiments, the height $H_3$ is greater than $H_4$ and $H_5$, the height $H_4$ is greater than $H_5$ and less than $H_3$, and the height $H_5$ is less than $H_4$ and $H_5$. In some other embodiments, the relationships of these heights can be reversed such that $H_5$ is the largest and $H_3$ is the smallest. In other embodiments, the height $H_4$ can be the largest height.

In some embodiments, the die package 100 the lower surface of the die package 100 may be curved such that the lower surface at the edge of the die package 100 is higher than the lower surface of the central region of the die package 100 by a distance $D_1$. In some embodiments, the distance D1 is in a range from 20 μm to 50 μm.

In FIG. 14, the die package 100 is bonded to the interposer 170 with the active conductive bumps 204A on the interposer 170 having varying heights to account for the warpage and/or curve of the die package 100.

FIG. 15 illustrates an exemplary layout of the active and dummy conductive pads 180A and 180B (and thus the layout of the active and dummy conductive bumps 204A and 204B) on a portion of the interposer 170. In the illustrated portion, the interposer 170 is divided into regions 402 and 404 with the regions 402 being the regions where the dummy pads 180B can be formed and regions 404 being the area where the dummy pads 180B cannot be formed. In some embodiments, the regions 402 are separated from the active pads 180A by a distance $D_2$. In some embodiments, the distance $D_2$ is in a range from 15 μm to 50 μm. The distance $D_2$ ensures that the dummy conductive bumps 204B do interfere with the active conductive bumps 204A. Although, FIG. 15 illustrates a checkerboard pattern for the regions 402 and 404, other patterns, such as, for example, rows, columns, concentric circles, the like, or a combination thereof for regions 402 are within the scope of this disclosure.

Figure 16A:
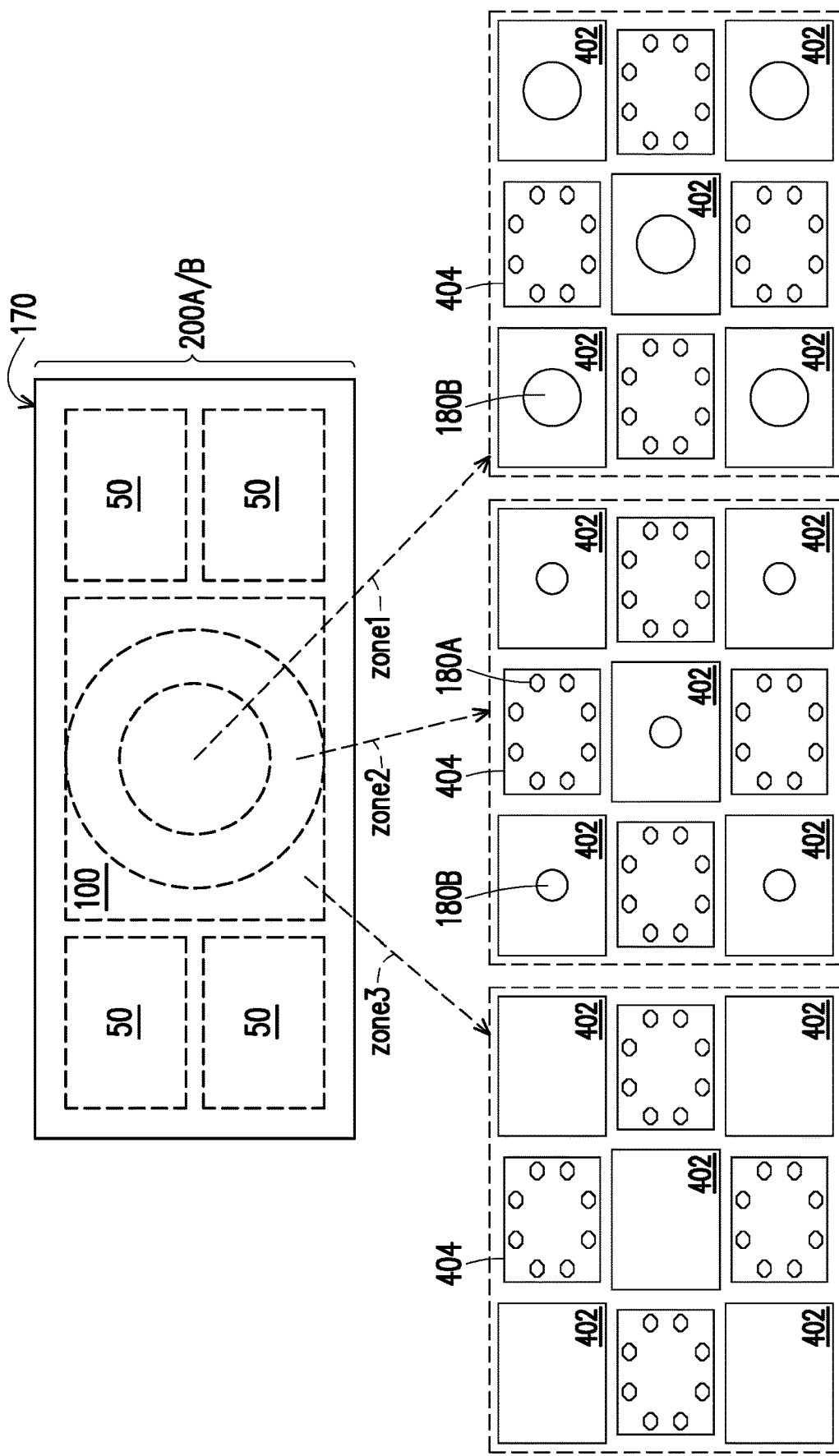

FIGS. 16A, 16B, 16C, and 16D are embodiments of the layout of a region 200A or 200B (see FIG. 12B) to have the active conductive bumps 204A achieve the smiling curve profile 310B in FIGS. 13 and 14. As illustrated in FIG. 16A, the layout of active and dummy pads 180A and 180B within the footprint of the die package 100 are configured into multiple zones or areas (labeled as zones 1-3 in FIG. 16A-D), such that the configuration of the dummy pads 180B can be different in each of the different zones. In FIG. 16A-D, the layout of the dummy pads 180B within the footprint of the die package 100 is divided into three zones with zones 1 and 2 being formed by concentric circles centered at a center point of the footprint of the die package 100 and zone 3 being the remaining portion of the footprint of the die package 100. In FIG. 16A-D, the zone 1 is in the center of footprint of the die package 100, the zone 2 is a ring that surrounds zone 1, and zone 3 is the remaining portion of the footprint of the die package 100 not in zone 1 or zone 2.

As discussed above, the pattern density of the active and dummy pads 180A and 180B affects the formed height of the active conductive bumps 204A, such that a greater pattern density of the active and dummy pads 180A and 180B leads to shorter active conductive bumps 204A. To achieve the smiling curve profile 310B in FIGS. 13 and 14—with taller active conductive bumps 204A towards the outer edges of the footprint of the die package 100 and shorter active conductive bumps 204A in the central region of the footprint of the die package 100—the pattern density of the active and dummy pads 180A and 180B needs to be greater in the central region of the footprint of the die package 100. In this embodiment, the pattern density of the active and dummy pads 180A and 180B in zone 1 is greater than both zones 2 and 3, the pattern density of the active and dummy pads 180A and 180B in zone 3 is less than both zones 2 and 1, and the pattern density of the active and dummy pads 180A and 180B in zone 2 is between zones 2 and 1.

Figure 16B:
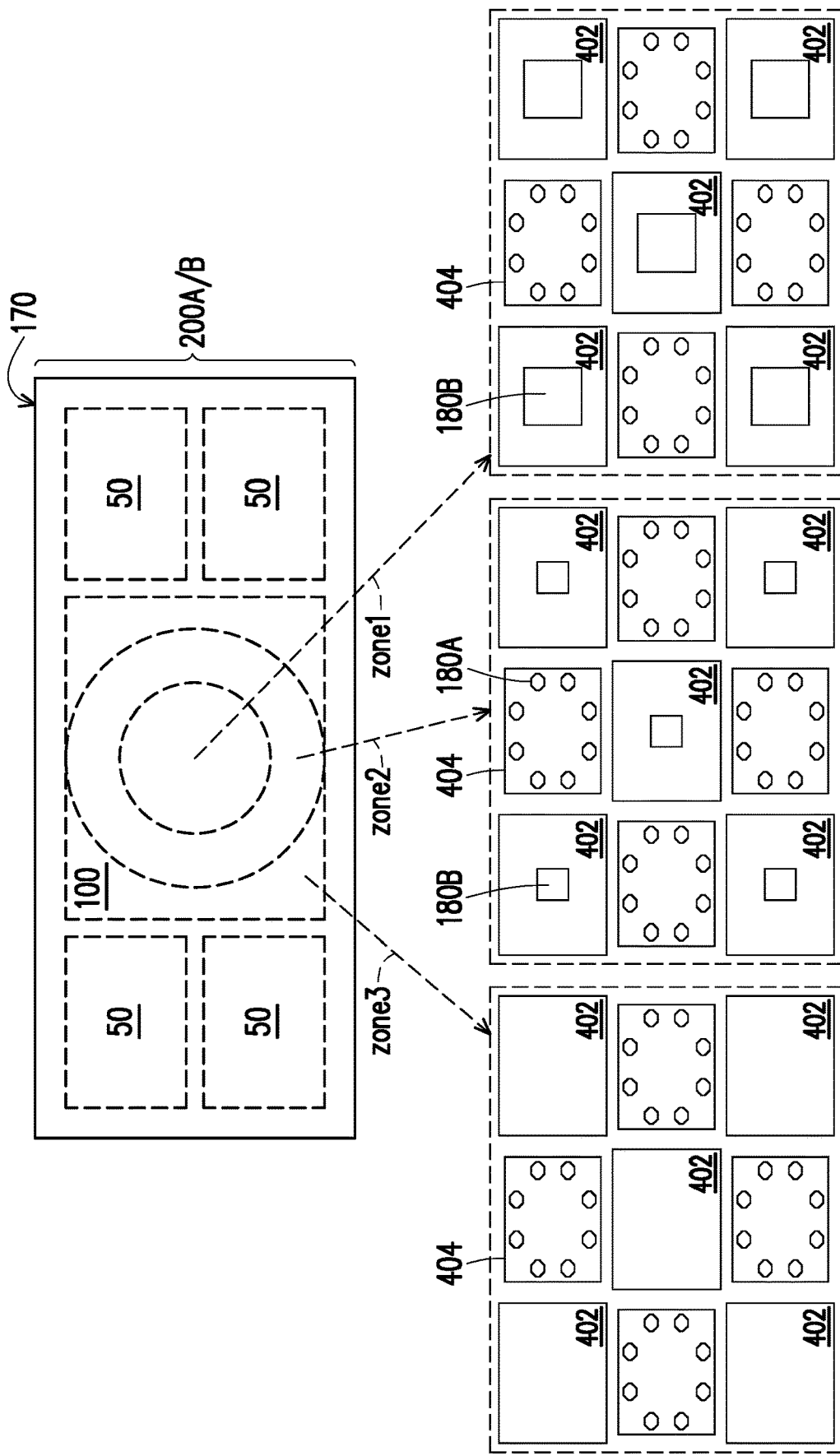

In FIG. 16A, the dummy pads 180B are circular in shape and have different sizes in the different zones. For example, the dummy pads 180B are largest in zone 1, smaller in zone 2, and smallest (or nonexistent) in zone 3. FIG. 16B illustrates a similar configuration to FIG. 16A except that the dummy pads 180B have a different shape and are square or rectangular.

Figure 16C:
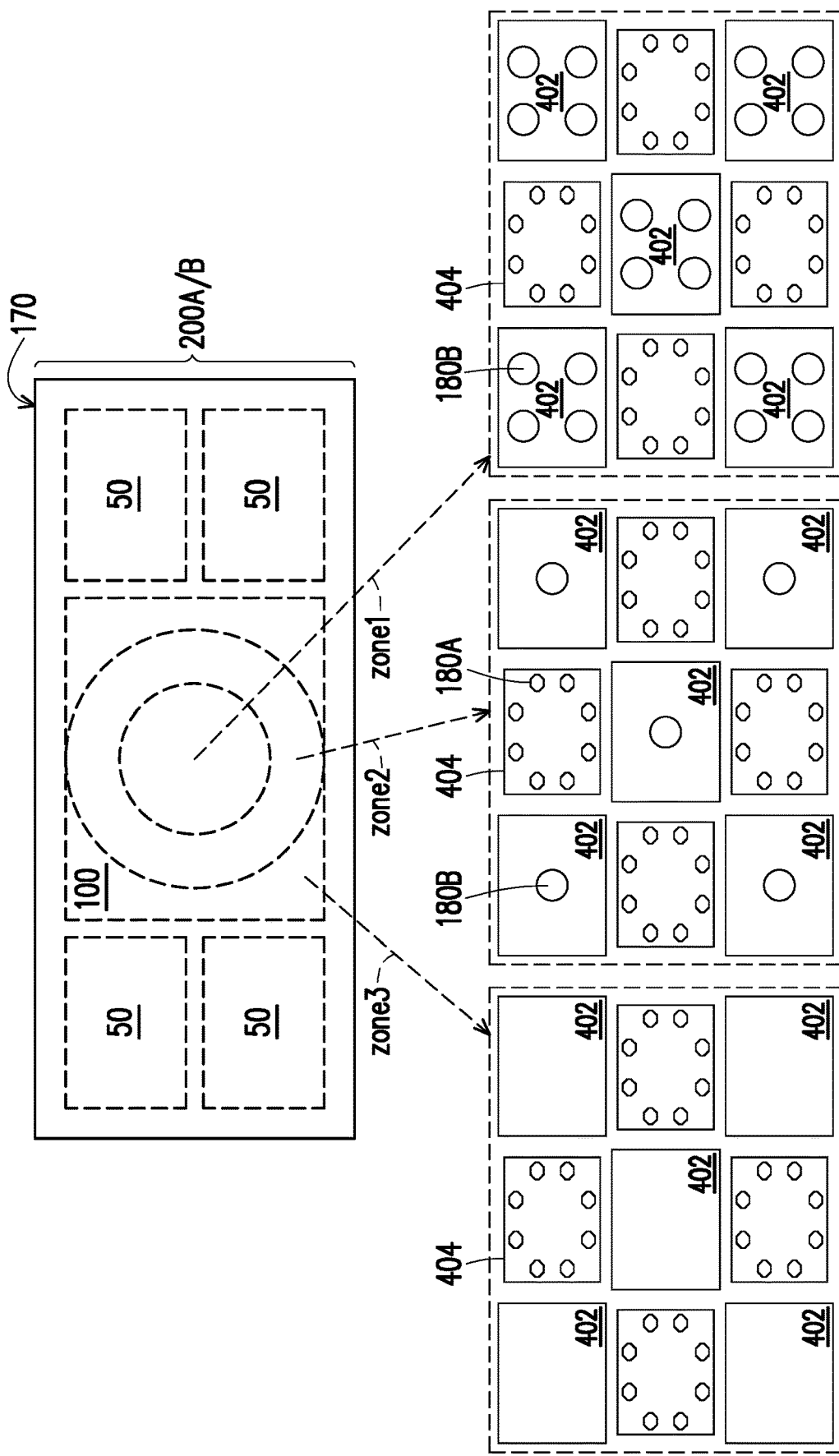
Figure 16D:
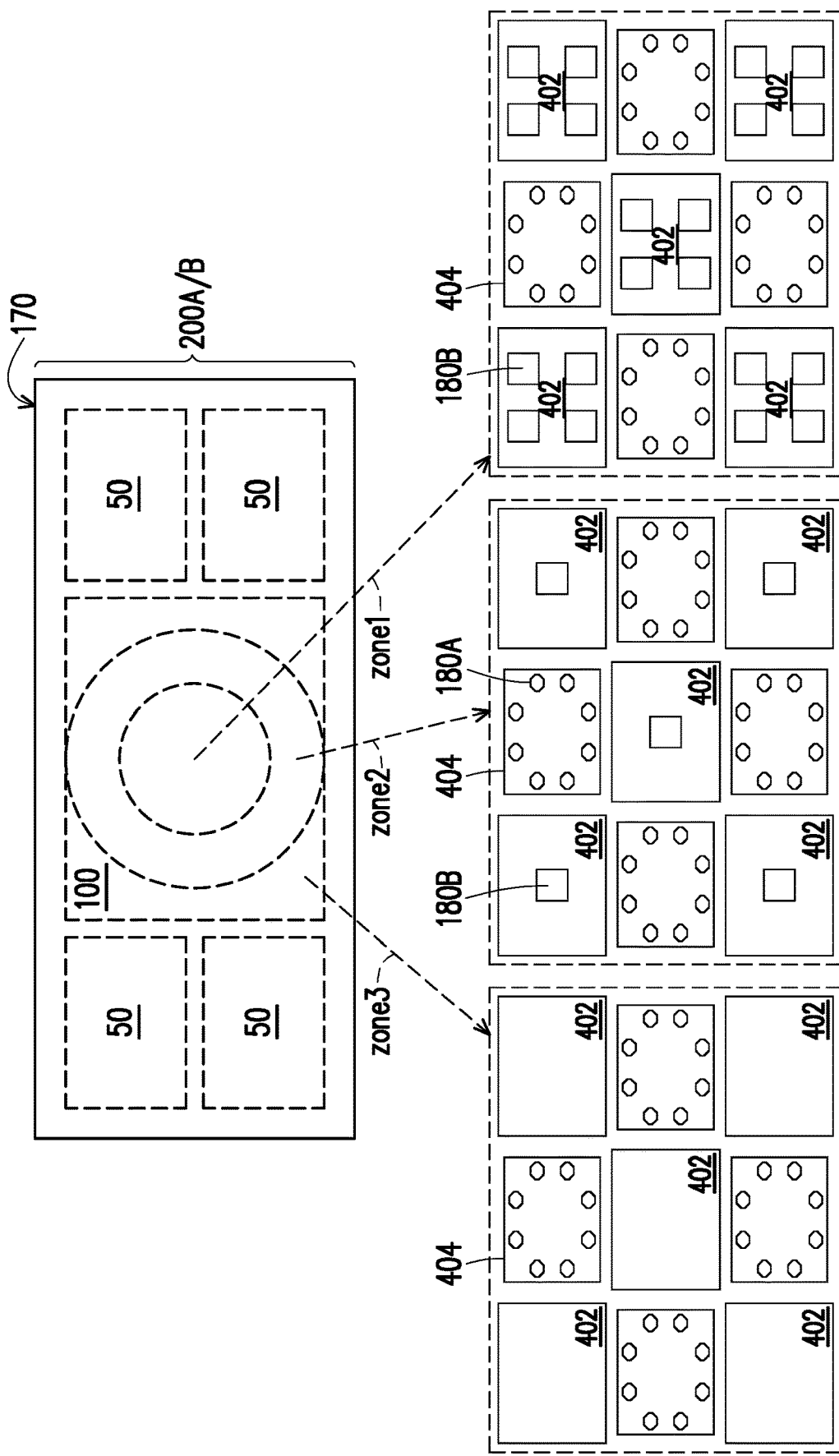

In FIG. 16C, the dummy pads 180B are circular in shape and similar size in each zone with different zones have different numbers of dummy pads 180B in each of the regions 402. For example, zone 1 has the most dummy pads 180B per region 402, zone 2 has fewer dummy pads 180B per region 402 than zone 1, and zone 3 has less (possibly zero) dummy pads 180B per region 402 than zone 2. FIG. 16D illustrates a similar configuration to FIG. 16C except that the dummy pads 180B have a different shape and are square or rectangular.

Although only four configurations with various sizes and shapes are illustrated, the disclosure contemplates more sizes and shapes of dummy pads 180B to achieve the varying pattern density goals of the zones 1-3. Further, the footprint of the die package 100 (or even the footprint of the entire interposer 170) can be divided into more or less zones, such as 2 zones, 4 zones, 5 zones, or even more zones.

Although the dummy pads, dummy bumps, and dummy connectors have been described as only being within the footprint of the die package 100, in some embodiments, there are dummy pads, dummy bumps, and dummy connectors. For example, there may be dummy pads, dummy bumps, and dummy connectors within the footprints of the integrated circuit devices 50 or outside of the footprints of the integrated circuit devices 50 and die packages 100.

In the embodiments, where the dummy pads, dummy bumps, and dummy connectors are formed only within the footprint of the die package 100, the conductive bumps 204 and 202 within the footprints of the integrated circuit devices 50 are formed to have a same height while the conductive bumps 204 and/or 202 within the footprints of the die packages 100 are formed to have a different heights.

Figure 17:
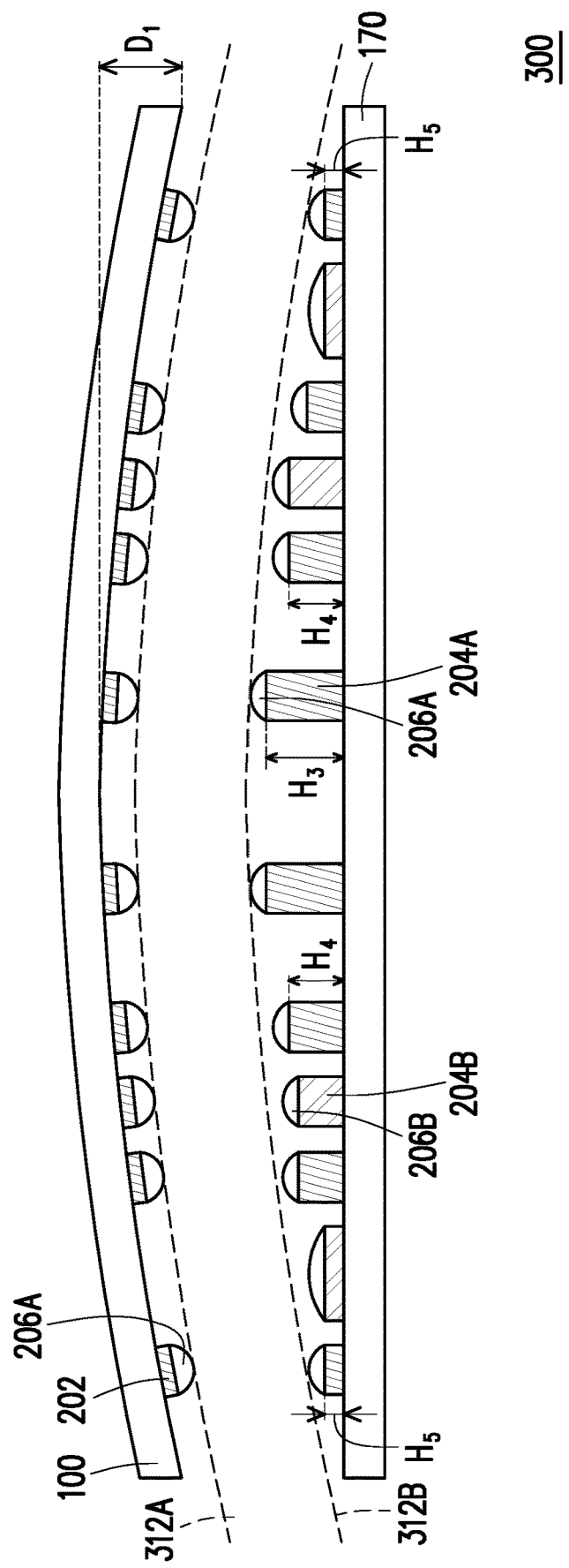

FIG. 17 illustrates a simplified version of a portion of a package 300 before bonding the die package 100 and the interposer 170. This embodiment is similar to embodiment in FIGS. 13 and 14 except that this embodiment has frowning curve profiles 312A and 312B. For example, in this embodiment, the taller active conductive bumps 204A are in the central region of the interposer 170 and the shorter active conductive bumps 204A are outside the central region. Details regarding this embodiment that are similar to those for the previously described embodiment will not be repeated herein.

FIGS. 18A, 18B, 18C, and 18D are embodiments of the layout of a region 200A or 200B (see FIG. 12B) to have the active conductive bumps 204A achieve the frowning curve profile 312B in FIG. 17. This embodiment is similar to embodiment in FIGS. 16A-16B except that this embodiment has frowning curve profiles 312A and 312B. Details regarding this embodiment that are similar to those for the previously described embodiment will not be repeated herein.

To achieve the frowning curve profile 312B in FIG. 17—with taller active conductive bumps 204A in the central region of the footprint of the die package 100 and shorter active conductive bumps 204A outside of the central region of the footprint of the die package 100—the pattern density of the active and dummy pads 180A and 180B needs to be greater outside the central region of the footprint of the die package 100. In this embodiment, the pattern density of the active and dummy pads 180A and 180B in zone 1 is less than both zones 2 and 3, the pattern density of the active and dummy pads 180A and 180B in zone 3 is greater than both zones 2 and 1, and the pattern density of the active and dummy pads 180A and 180B in zone 2 is between zones 2 and 1.

Figure 18A:
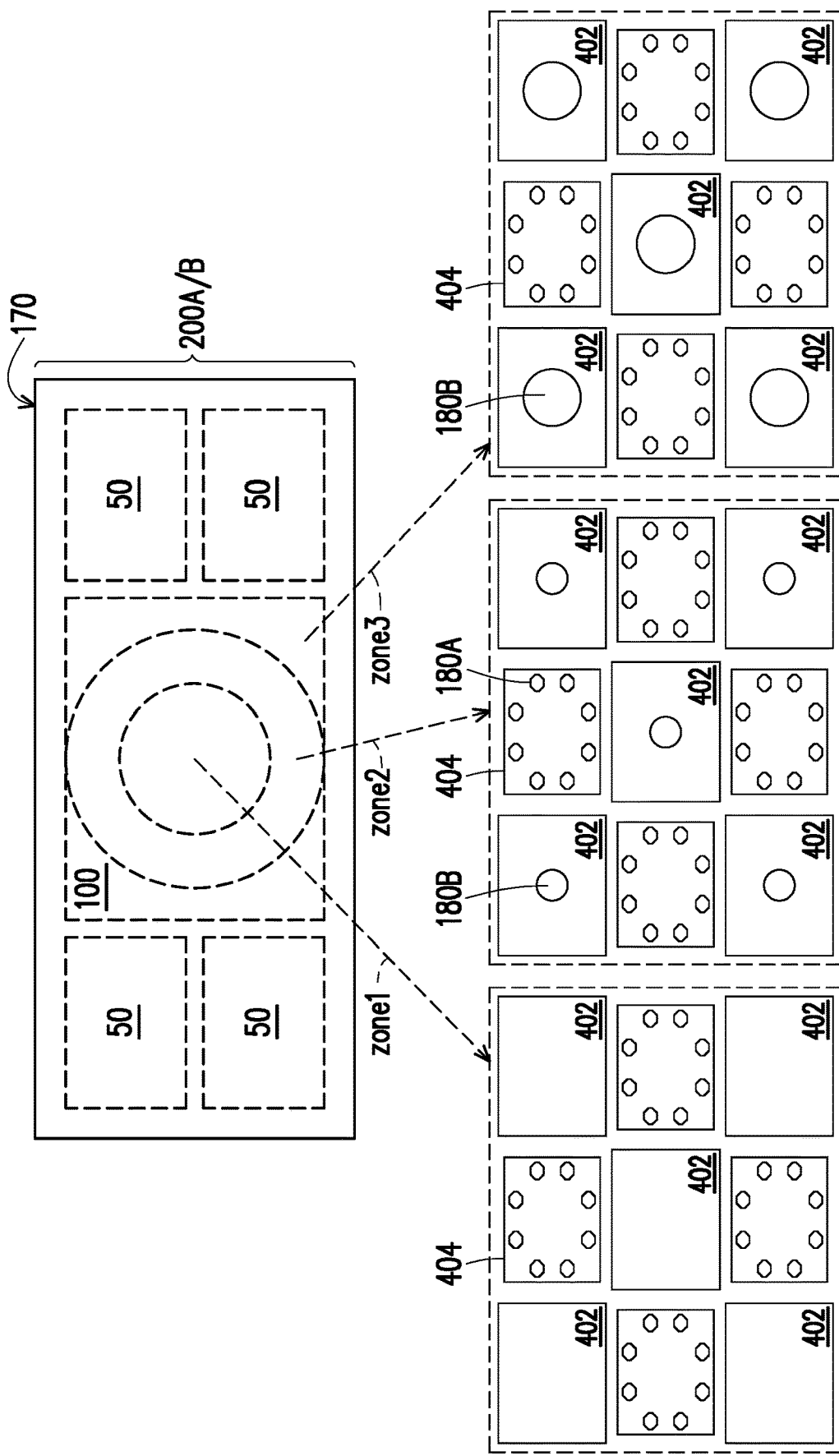
Figure 18B:
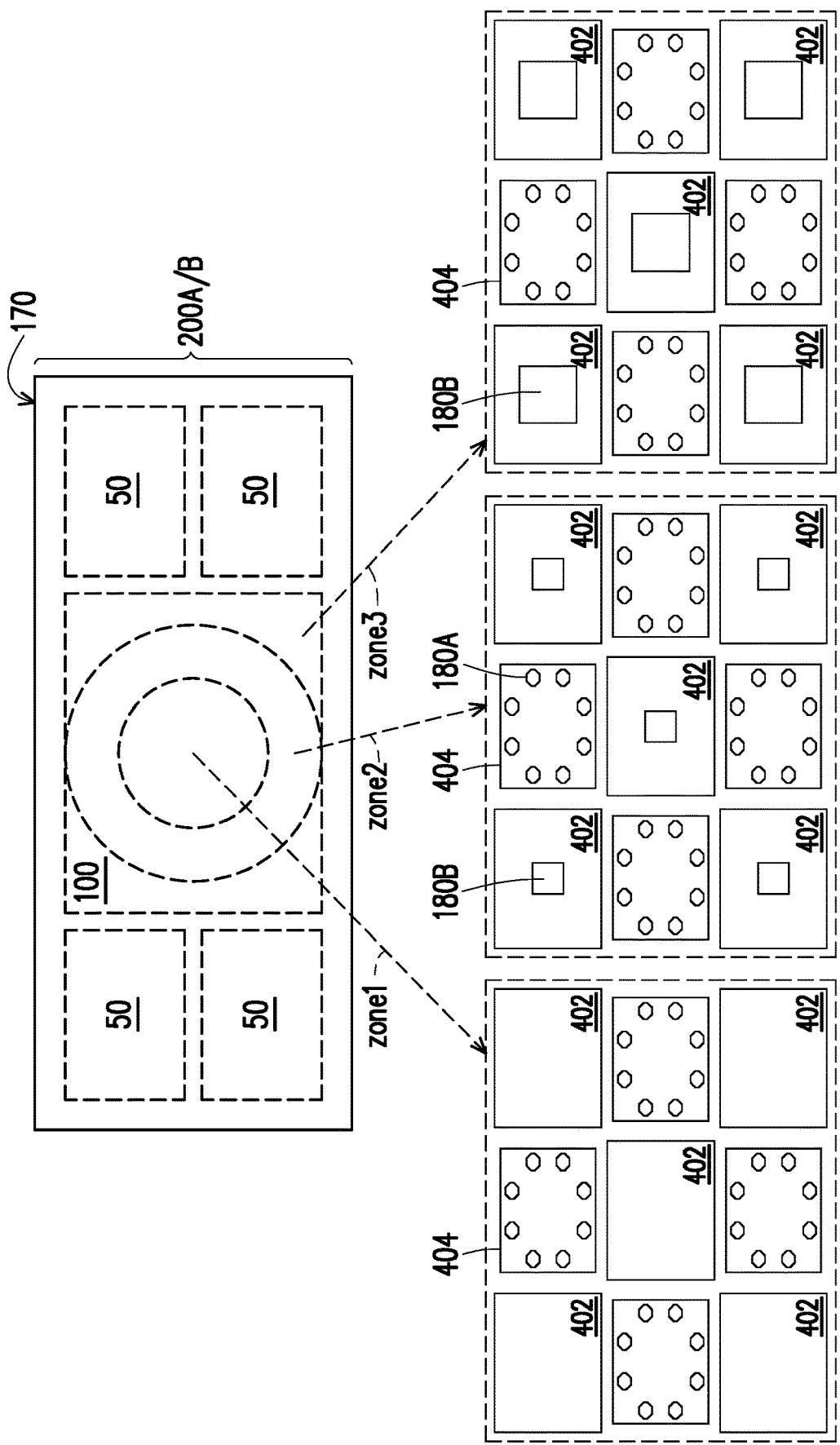

In FIG. 18A, the dummy pads 180B are circular in shape and have different sizes in the different zones. For example, the dummy pads 180B are largest in zone 3, smaller in zone 2, and smallest (or nonexistent) in zone 1. FIG. 18B illustrates a similar configuration to FIG. 18A except that the dummy pads 180B have a different shape and are square or rectangular.

Figure 18C:
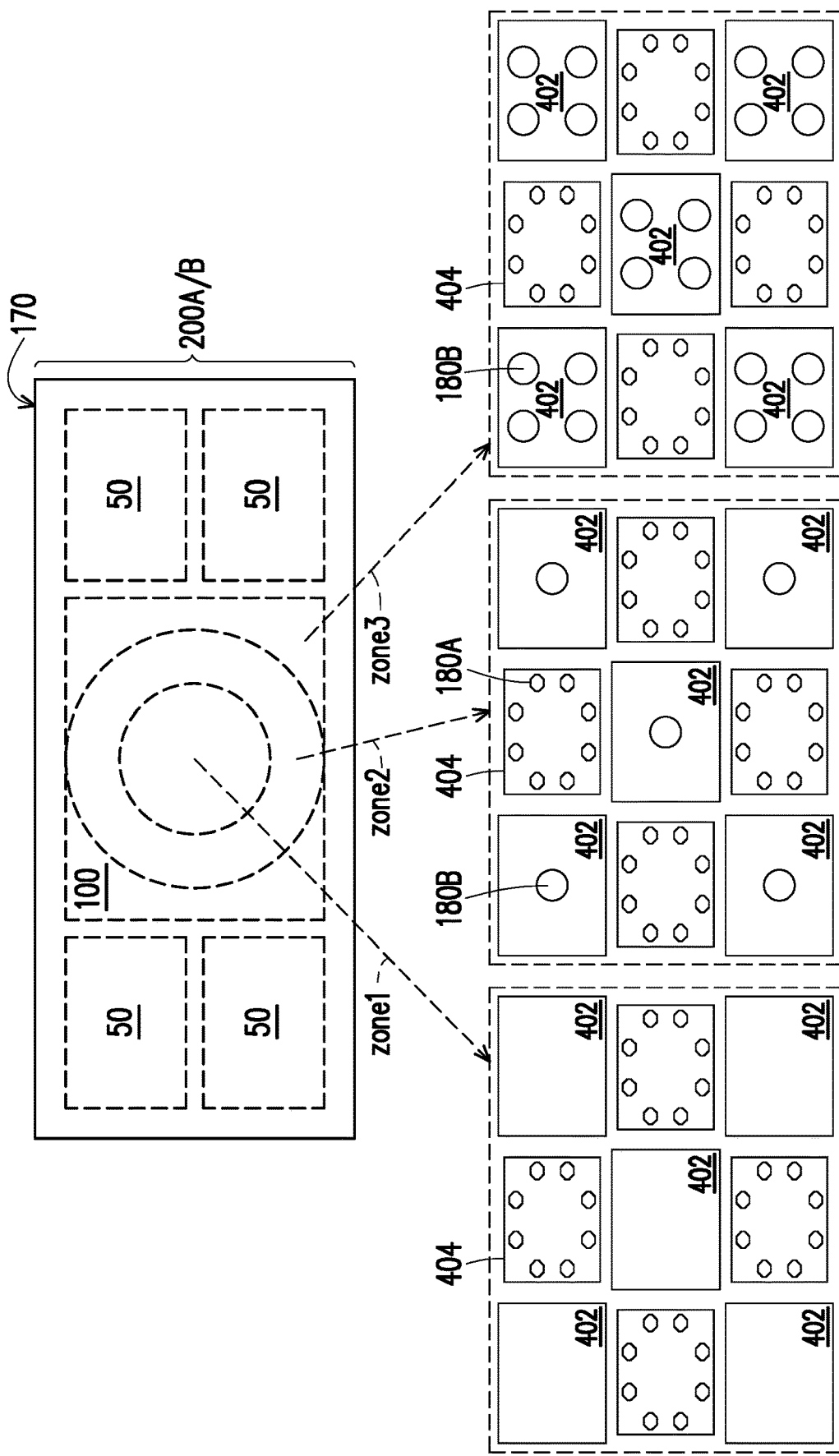
Figure 18D:
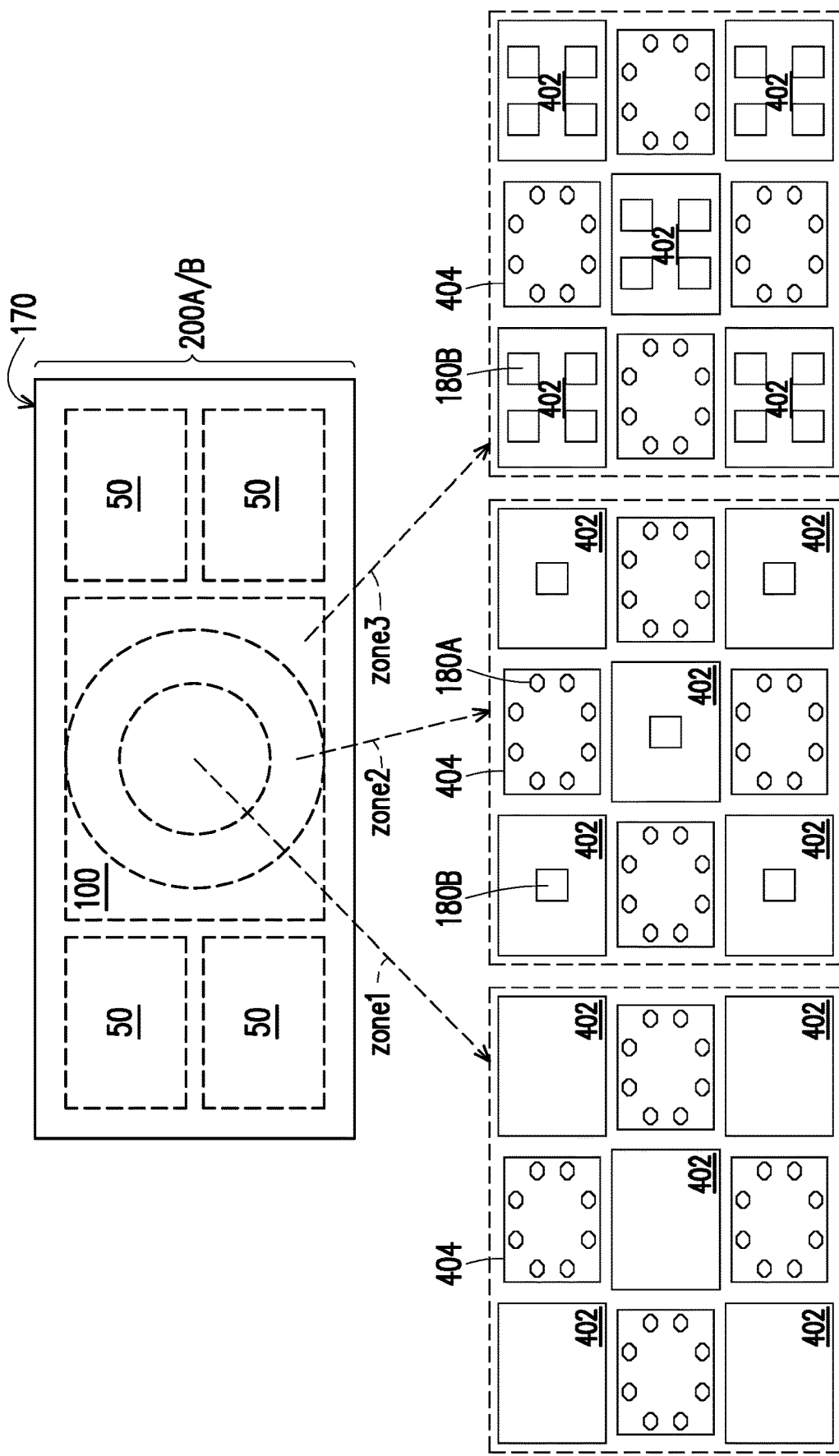

In FIG. 18C, the dummy pads 180B are circular in shape and similar size in each zone with different zones have different numbers of dummy pads 180B in each of the regions 402. For example, zone 3 has the most dummy pads 180B per region 402, zone 2 has fewer dummy pads 180B per region 402 than zone 3, and zone 1 has less (possibly zero) dummy pads 180B per region 402 than zone 2. FIG. 18D illustrates a similar configuration to FIG. 16C except that the dummy pads 180B have a different shape and are square or rectangular.

The interposer 170 has connectors with variable heights which can account for warpage of the integrated circuit dies and/or wafer. In some embodiments, the connectors are micro-bumps formed by a plating method. In those embodiments, the variable height micro-bumps are achieved by adjusting the pattern density of the micro-bumps in certain regions during the formation process by inserting dummy micro-bumps on one or both of the integrated circuit device and the wafer. For example, if a first region is desired to have shorter micro-bump heights as compared to a second region, the pattern density of the micro-bumps in the first region will be increased by inserting dummy micro-bumps in the first region. This formation of variable height connectors can prevent cold joints or broken connectors, and thus, can increase the reliability and yield of the devices.

Figure 19:
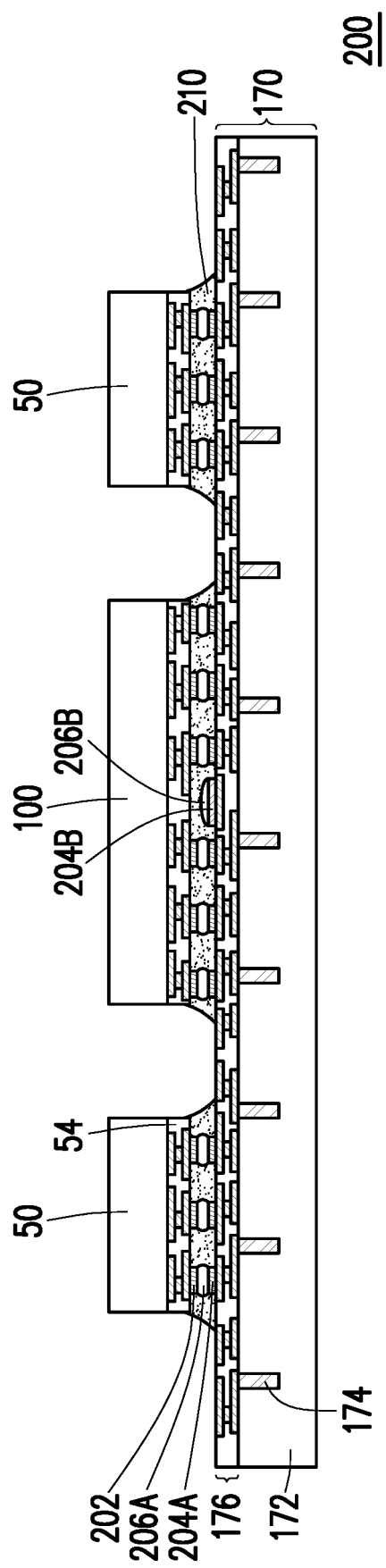

In FIG. 19, an underfill material 210 is dispensed between the integrated circuit devices 50 and the die packages 100 and the interconnect structure 176. The underfill material 210 surrounds the active and conductive bumps 202A/B and 204A/B, the active and dummy conductive connectors 206A/B. The underfill material 210 has fillets that extend up along sides of the integrated circuit devices 50 and die packages 100. The underfill material 210 may be any acceptable material, such as a polymer, epoxy, molding underfill, or the like. The underfill material 210 may be formed by a capillary flow process. The underfill 210 separates and isolates the dummy conductive bump 204B and dummy conductive connector 206B from the die package 100.

Figure 20:
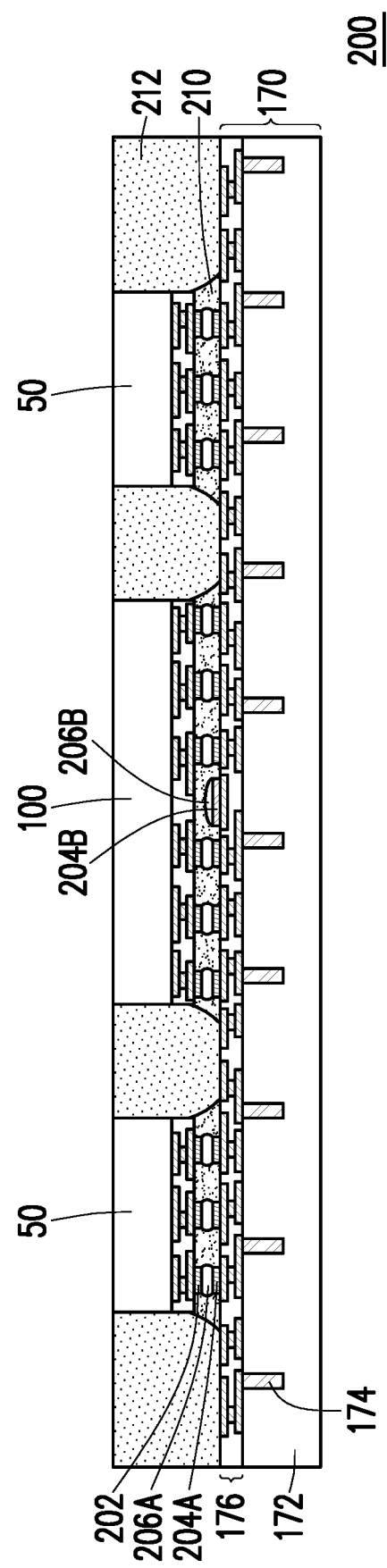

In FIG. 20, an encapsulant 212 is formed on the various components. The encapsulant 212 may be a molding compound, epoxy, or the like, and may be applied by compression molding, transfer molding, or the like. The encapsulant 212 may be formed over the interconnect structure 176 such that the integrated circuit devices 50, the die packages 100, and the underfill material 210 are buried or covered. The encapsulant 212 is then cured. In some embodiments, the encapsulant 212 is thinned such that top surfaces of the encapsulant 212, the integrated circuit devices 50, and die packages 100 are level.

Figure 21:
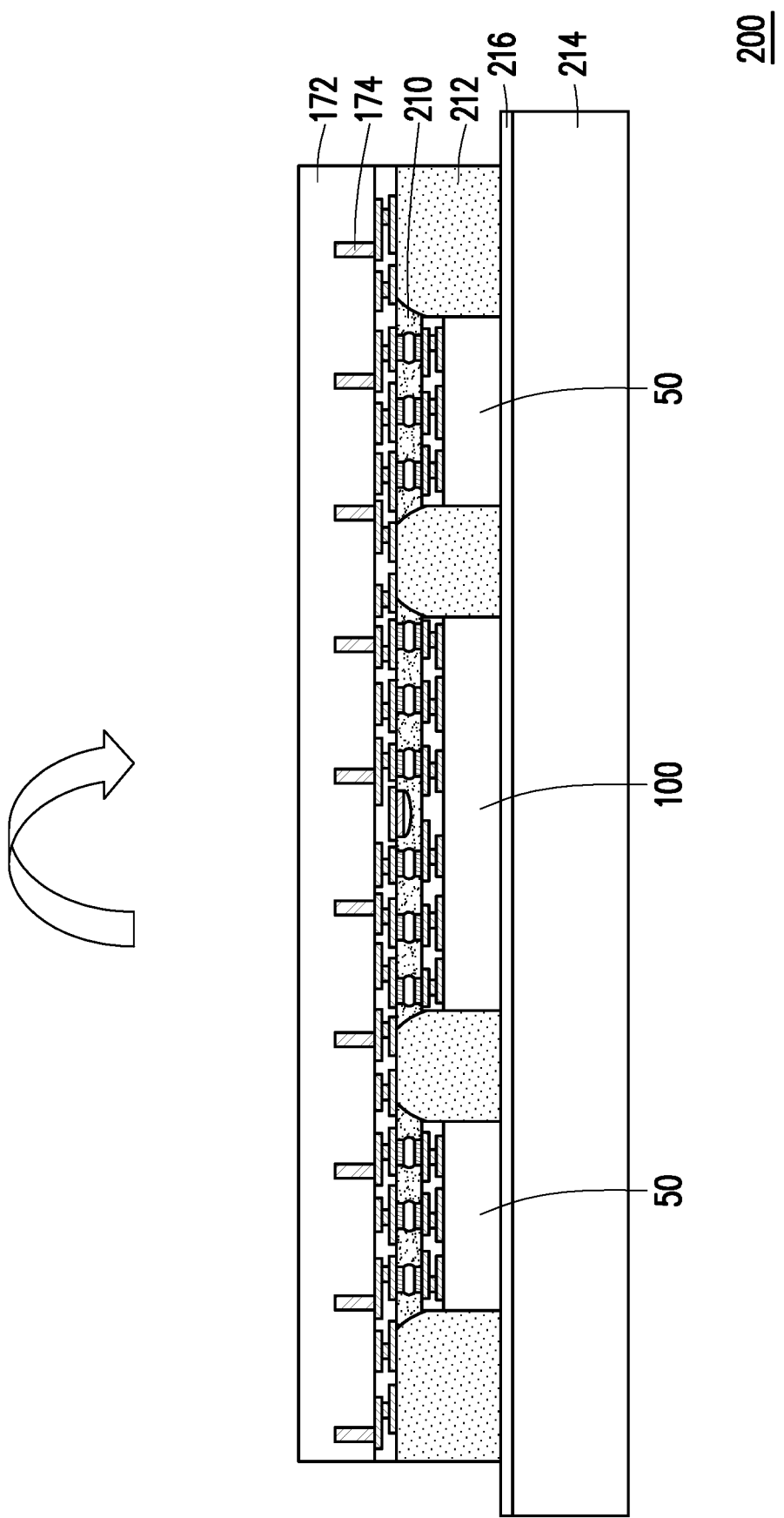

In FIG. 21, the intermediate structure is flipped over to prepare for processing of the back side of the substrate 172. The intermediate structure may be placed on a carrier substrate 214 or other suitable support structure for subsequent processing. For example, the carrier substrate 214 may be attached to the encapsulant 212. The intermediate structure may be attached to the carrier substrate 214 by a release layer 216. The release layer 216 may be formed of a polymer-based material, which may be removed along with the carrier substrate 214 from the overlying structures. In some embodiments, the carrier substrate 214 is a substrate such as a bulk semiconductor or a glass substrate, and may have any thickness, such as a thickness of about 300 mm. In some embodiments, the release layer 216 is an epoxy-based thermal-release material, which loses its adhesive property when heated, such as a light-to-heat-conversion (LTHC) release coating.

Figure 22:
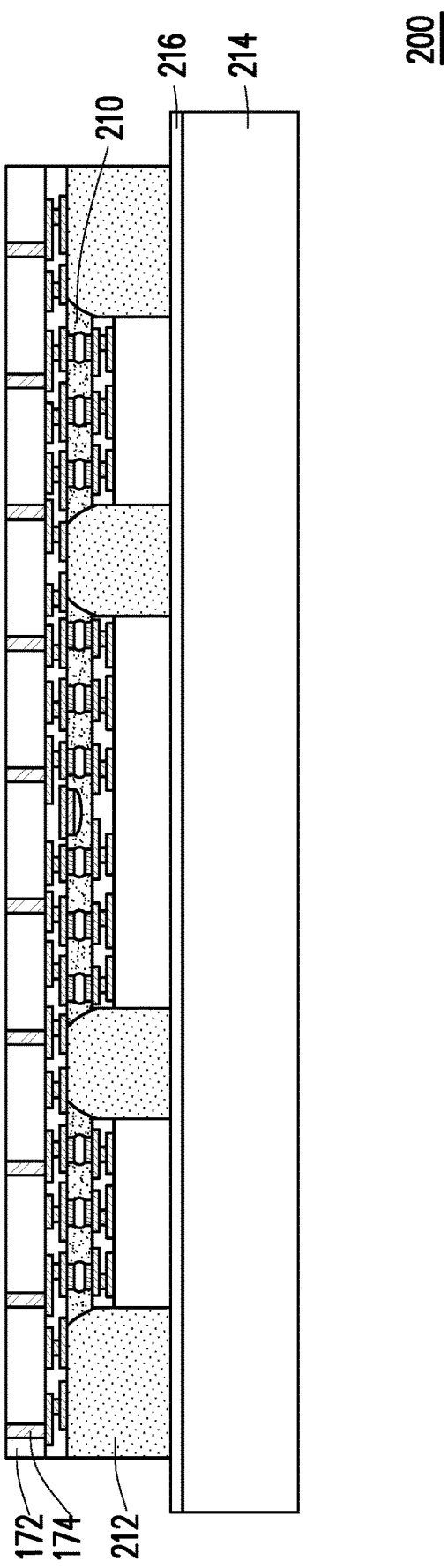
Figure 23:
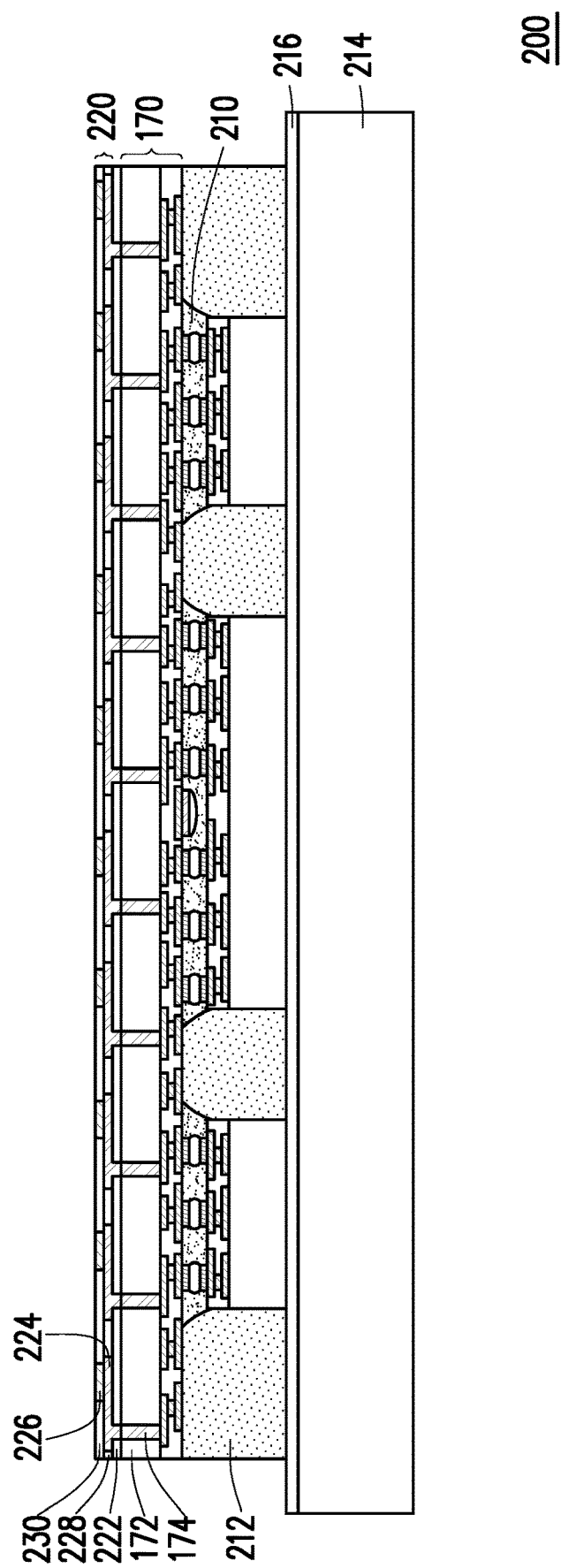

In FIG. 22, the substrate 172 is thinned to expose the through vias 174. In some embodiments, exposed surfaces of the substrate 172 and through vias 174 are level. Exposure of the through vias 174 may be accomplished by a thinning process, such as a grinding process, a chemical-mechanical polish (CMP), or other acceptable removal process. In some embodiments (not shown), a recessing process may be performed to recess the substrate 172 such that the through vias 174 protrude from the back side of the substrate 172. The recessing process may be, e.g., a suitable etch-back process. An insulating layer may be formed on the back side of the substrate 172, surrounding and protecting the protruding portions of the through vias 174.

In FIG. 12, a redistribution structure 220 is formed over the back side of the substrate 172. The redistribution structure 220 includes a dielectric layer 222, UBMs 224, and conductive bumps 226. The redistribution structure 220 is shown as an example. More or fewer dielectric layers and conductive layers may be formed in the redistribution structure 220. If more dielectric layers and metallization patterns are to be formed, steps and processes discussed below may be repeated.

As an example to form the redistribution structure 220, the dielectric layer 222 is deposited on the back side of the substrate 172 and the through vias 174. In some embodiments, the dielectric layer 222 is formed of a photo-sensitive material such as polybenzoxazole (PBO), polyimide, benzocyclobutene (BCB), or the like, which may be patterned using a lithography mask. The dielectric layer 222 may be formed by spin coating, lamination, CVD, the like, or a combination thereof. The dielectric layer 222 is then patterned. The patterning forms openings exposing portions of the through vias 174. The patterning may be by an acceptable process, such as by exposing the dielectric layer 222 to light when the dielectric layer 222 is a photo-sensitive material or by etching using, for example, an anisotropic etch. If the dielectric layer 222 is a photo-sensitive material, the dielectric layer 222 can be developed after the exposure.

The UBMs 224 are then formed. The UBMs 224 include conductive lines on and extending along the major surface of the dielectric layer 222. The UBMs 224 further include conductive vias extending through the dielectric layer 222 to be physically and electrically connected to the through vias 174. A seed layer (not shown) is formed over the dielectric layer 222 and in the openings extending through the dielectric layer 222. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like.

A dielectric layer 228 is then formed and patterned on the seed layer. In some embodiments, the dielectric layer 228 is formed of a photo-sensitive material such as a photoresist, PBO, polyimide, BCB, or the like, which may be patterned using a lithography mask. The dielectric layer 228 may be formed by spin coating, lamination, CVD, the like, or a combination thereof and may be exposed to light for patterning. The pattern of the dielectric layer 228 corresponds to the UBMs 224. The patterning forms openings through the dielectric layer 228 to expose the seed layer. A conductive material is then formed in the openings of the dielectric layer 228 and on the exposed portions of the seed layer. The conductive material may be formed by plating, such as electroplating or electroless plating, or the like. The conductive material may include a metal, such as copper, titanium, tungsten, aluminum, or the like. The combination of the conductive material and underlying portions of the seed layer forms the UBMs 224.

The conductive bumps 226 are then formed. A dielectric layer 230 is formed and patterned on the UBMs 224 and dielectric layer 228. The dielectric layer 230 may be similar to the dielectric layer 228. The dielectric layer 230 may be exposed to light for patterning. The pattern of the dielectric layer 230 corresponds to the conductive bumps 226. The patterning forms openings through the dielectric layer 230, exposing portions of the UBMs 224. A conductive material is then formed in the openings of the dielectric layer 230 and on the exposed portions of the UBMs 224. The conductive material may be formed by plating, such as electroplating or electroless plating, or the like. The conductive material may include a metal, such as copper, titanium, tungsten, aluminum, or the like. Because the UBMs 224 are exposed by the openings in the dielectric layer 230, no seed layer is formed in the openings. Rather, the conductive material is formed directly and physically on the UBMs 224. The conductive material is formed by performing a plating process with the same plating process parameters as the plating process used to form the conductive material of the UBMs 224. Notably, no seed layer is formed between the UBMs 224 and conductive bumps 226. Rather, the conductive material of the conductive bumps 226 is formed by performing a plating process using the seed layer of the UBMs 224.

Figure 24:
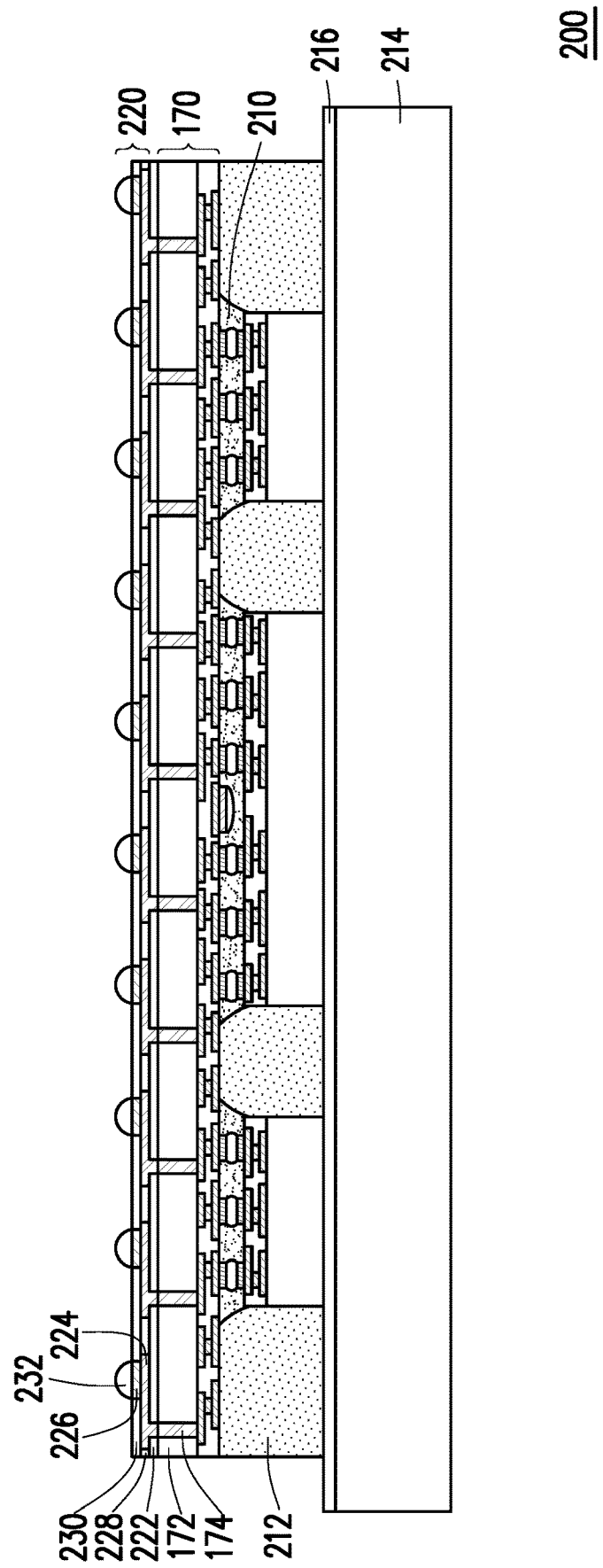
Figure 25:
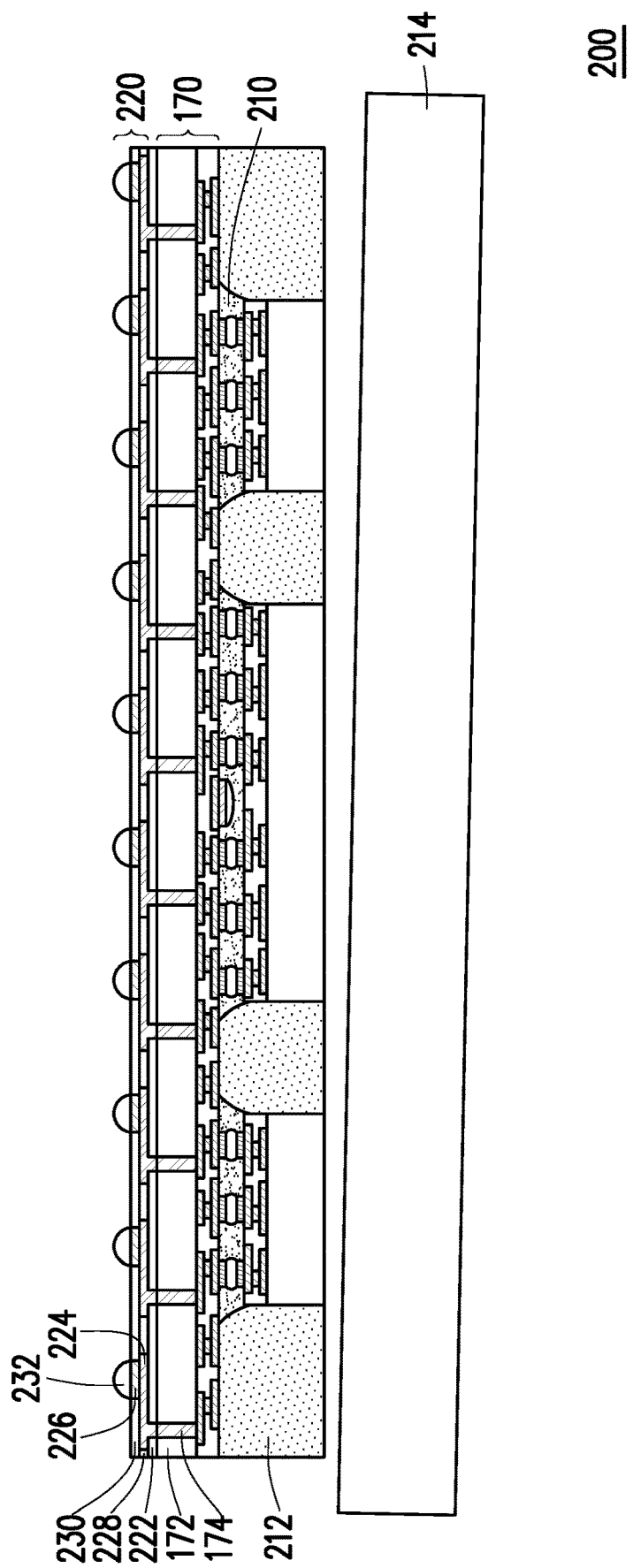

In FIG. 24, conductive connectors 232 are formed on the conductive bumps 226. The conductive connectors 232 may be formed from a conductive material such as solder, and may be formed by initially forming a layer of solder on the conductive bumps 226 through methods such as evaporation, electroplating, printing, solder transfer, ball placement, or the like. Once the layer of solder has been formed, a reflow process may be performed in order to shape the conductive connectors 232 into desired bump shapes. The conductive connectors 232 may be ball grid array (BGA) connectors, solder balls, controlled collapse chip connection (C4) bumps, or the like. The UBMs 224 laterally offset the conductive connectors 232 from the through vias 174. Because no seed layer is formed between the UBMs 224 and the conductive bumps 226, the conductive bumps 226 are a conductive material extending continuously from the UBMs 224 to the conductive connectors 232.

In FIG. 25, a carrier de-bonding is performed to detach (de-bond) the carrier substrate 214 from the encapsulant 212. In accordance with some embodiments, the de-bonding includes projecting a light such as a laser light or an ultraviolet (UV) light on the release layer 216 so that the release layer 216 decomposes under the heat of the light and the carrier substrate 214 can be removed. The structure is then flipped over and placed on a tape. Subsequently, the interposer 170 is singulated along scribe line regions between adjacent device regions to form the device package 200. The singulation may be by sawing, dicing, or the like. As a result of the singulation process, edges of the interposer 170 and encapsulant 212 are coterminous. In other words, the outer sidewalls of the interposer 170 have the same width as the outer sidewalls of the encapsulant 212. The dielectric layer 228 and dielectric layer 230 may optionally be removed before or after the carrier de-bonding.

Figure 26:
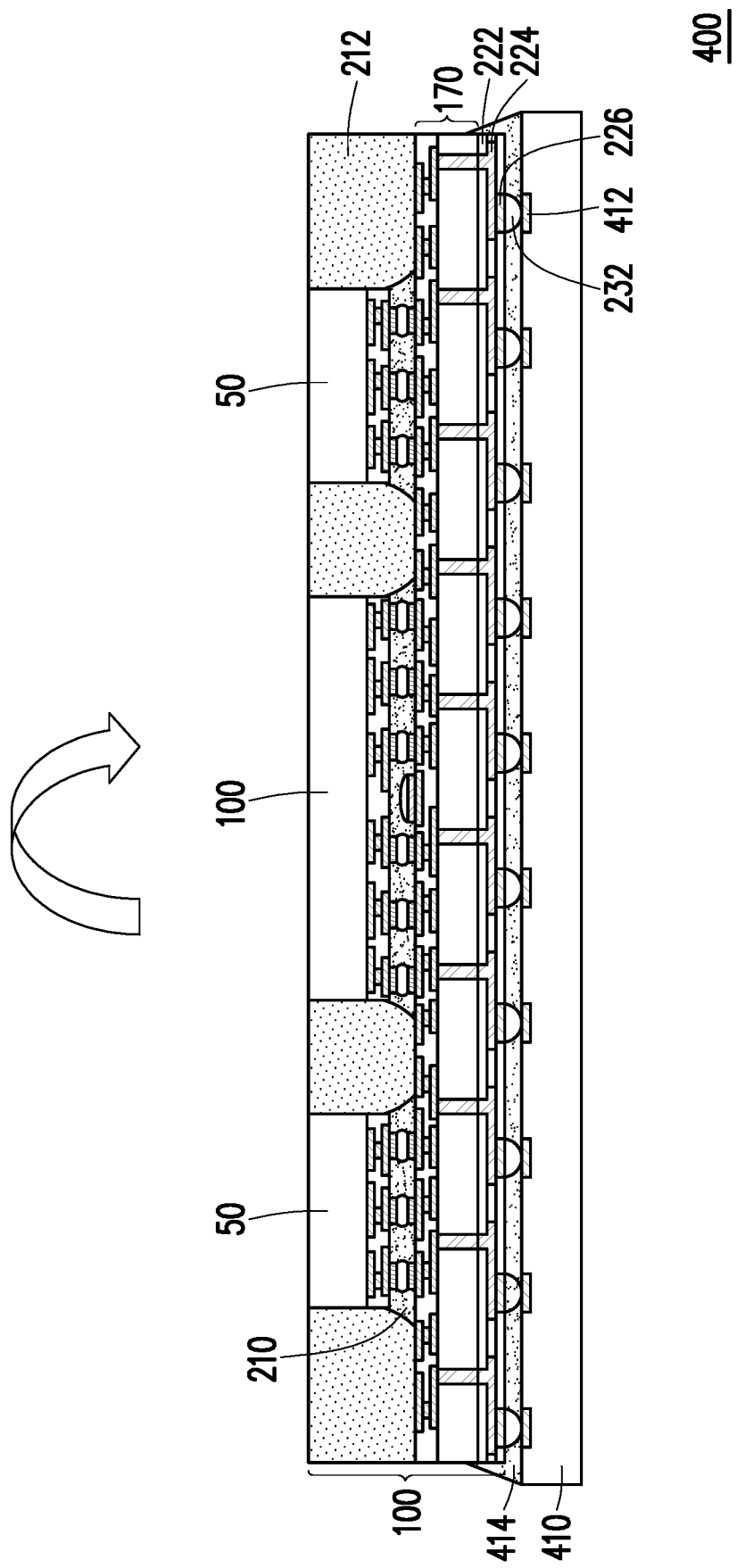

In FIG. 26, a device package 300 is formed by mounting the device package 200 to a package substrate 410. The package substrate 410 may be made of a semiconductor material such as silicon, germanium, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 410 may be a SOI substrate. In some embodiments, a SOI substrate includes a layer of a semiconductor material such as epitaxial silicon, germanium, silicon germanium, SOI, or combinations thereof. The package substrate 410 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for package substrate 410.

The package substrate 410 may include active and passive devices. As one of ordinary skill in the art will recognize, a wide variety of devices such as transistors, capacitors, resistors, combinations of these, and the like may be used to generate the structural and functional requirements of the design for the device package 400. The devices may be formed using any suitable methods.

The package substrate 410 may also include metallization layers and vias and bond pads 412 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 410 is substantially free of active and passive devices.

The conductive connectors 232 are reflowed to attach the device package 200 to the bond pads 412, thereby bonding the interposer 170 to the package substrate 410. The conductive connectors 232 electrically and physically couple the package substrate 410, including metallization layers in the package substrate 410, to the device package 200. As noted above, physically separating portions of the underfill material 210 may reduce warpage of the device package 200. Stand-off height variation between the package substrate 410 and interposer 170 may thus be reduced, which may help avoid cold joints and bridging when reflowing the conductive connectors 232. Manufacturing yield may thus be improved.

The conductive connectors 232 may have an epoxy flux formed thereon before they are reflowed, with at least some of the epoxy portion of the epoxy flux remaining after the device package 200 is attached to the package substrate 410. This remaining epoxy portion may act as an underfill to reduce stress and protect the joints resulting from the reflowing the conductive connectors 232.

In some embodiments, passive devices (e.g., surface mount devices (SMDs), not illustrated) are attached to the device package 400 (e.g., bonded to the bond pads 412) prior to mounting on the package substrate 410. In such embodiments, the passive devices may be bonded to a same surface of the package substrate 410 as the conductive connectors 232.

An underfill 414 may be formed between the device package 200 and the package substrate 410, surrounding the conductive connectors 232, conductive bumps 226, and UBMs 224. Due to the process for forming the UBMs 224, they are not surrounded by dielectric or insulating layers after formation. As such, the underfill 414 directly contacts and extends along sides of the UBMs 224. Further, the underfill 414 is a continuous material extending from the package substrate 410 to the dielectric layer 222. The underfill 414 may be formed by a capillary flow process after the device package 200 is attached or may be formed by a suitable deposition method before the device package 200 is attached.

Optionally, a heat spreader may be attached to the device package 400, covering and surrounding the device package 200. The heat spreader may be formed from a material with high thermal conductivity, such as steel, stainless steel, copper, the like, or combinations thereof. The heat spreader protects the device package 200 and forms a thermal pathway to conduct heat from the various components of the device package 400.

Figure 27:
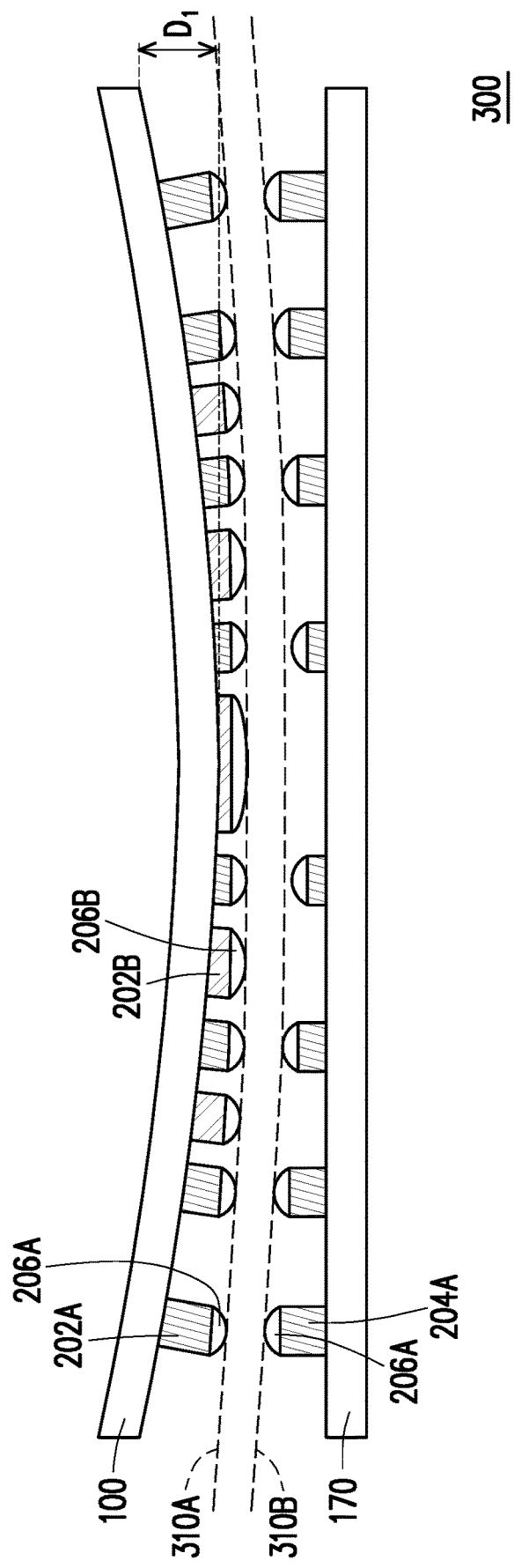
FIGS. 27 and 28 are cross-sectional views of configurations of active and dummy connectors in accordance with some embodiments.

FIG. 27 illustrates a simplified version of a portion of a package 300 before bonding the die package 100 and the interposer 170. This embodiment is similar to embodiment in FIGS. 13 and 14 except that this embodiment includes dummy conductive bumps 202A on the die package 100 instead of the dummy conductive bumps 204A on the interposer 170. The various configurations of active and dummy bumps as disclosed in FIGS. 13-15, 16A-16D, 17, and 18A-18D are applicable to the embodiment in FIG. 27. Details regarding this embodiment that are similar to those for the previously described embodiment will not be repeated herein.

Figure 28:
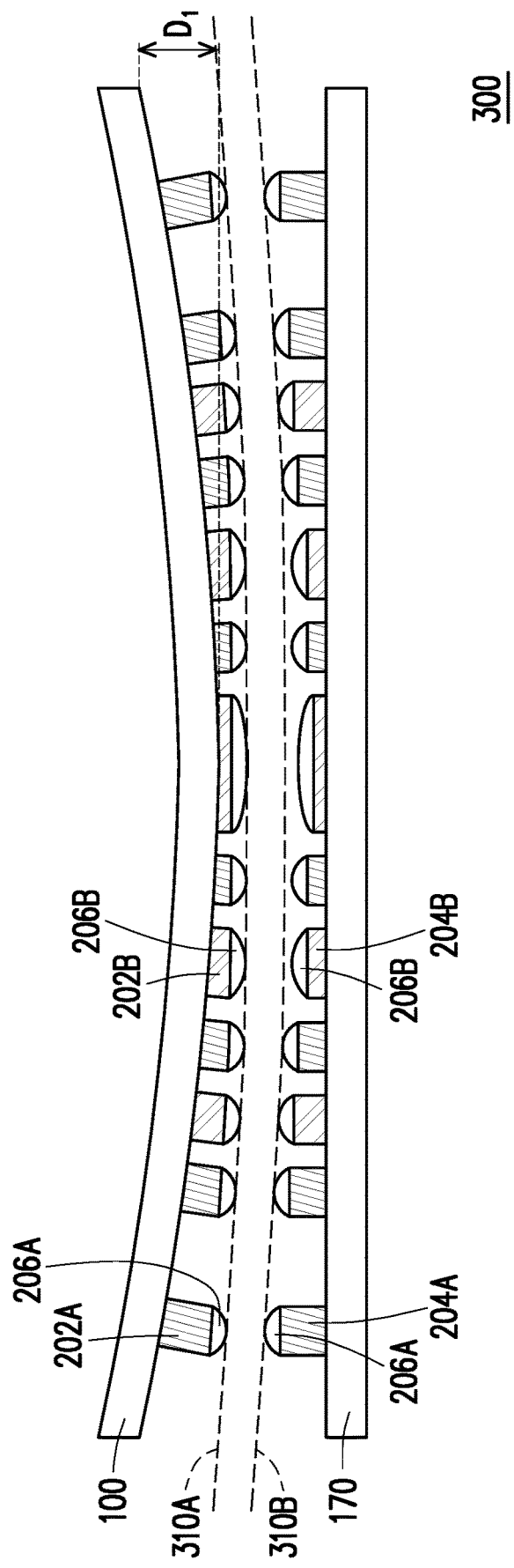

FIG. 28 illustrates a simplified version of a portion of a package 300 before bonding the die package 100 and the interposer 170. This embodiment is similar to embodiment in FIGS. 13, 14, and 27 except that this embodiment includes the dummy conductive bumps 202A on the die package 100 and the dummy conductive bumps 204A on the interposer 170. The various configurations of active and dummy bumps as disclosed in FIGS. 13-15, 16A-16D, 17, and 18A-18D are applicable to the embodiment in FIG. 28. Details regarding this embodiment that are similar to those for the previously described embodiment will not be repeated herein.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments described herein may achieve advantages. In accordance with some embodiments, the embodiments include connectors with variable heights which can account for warpage of the integrated circuit dies and/or interposer. In some embodiments, the connectors are micro-bumps formed by a plating method. In those embodiments, the variable height micro-bumps are achieved by adjusting the pattern density of the micro-bumps in certain regions during the formation process by inserting dummy micro-bumps on one or both of the integrated circuit device and the wafer. For example, if a first region is desired to have shorter micro-bump heights as compared to a second region, the pattern density of the micro-bumps in the first region will be increased by inserting dummy micro-bumps in the first region. This formation of variable height connectors can prevent cold joints or broken connectors, and thus, can increase the reliability and yield of the devices Further, the packages described herein allow for devices of different function or technology to be incorporated, which can increase functionality and reduce cost. By bonding semiconductor devices to form a bonded die package (e.g., a system-on-a-chip (SoC) or the like) within a package, the size of the package may be reduced. The package may include both a bonded die package and another semiconductor die, such as a memory die, I/O die, or the like. The bonded die package and the semiconductor die can be connected to the same redistribution structure, which can allow for shorter routing between the bonded die package and the semiconductor die. The redistribution structure may have vias of different sizes to connect to different devices, such as to through vias of a bonded die package or to contact pads of a semiconductor die. In some cases in which the connections (e.g., through vias or conductive pads) of a device have a relatively small pitch, a single via of the redistribution structure may connect to multiple connections. The use of a bonded die package or shorter routing in this manner may improve high-frequency or high-speed operation of a package. The bonded die package may include multiple semiconductor devices or stacks of semiconductor devices, which can allow for reduced cost and greater flexibility of design. In some cases, the use of different protecting materials within a bonded die package can reduce the chance of defects occurring, for example, due to CTE mismatch or diffusion of dopants into the bonded die package.

In an embodiment, an interposer has a first side, a first integrated circuit device attached to the first side of the interposer with a first set of conductive connectors, each of the first set of conductive connectors having a first height. The package also includes a first die package attached to the first side of the interposer with a second set of conductive connectors, the second set of conductive connectors including a first conductive connector and a second conductive connector, the first conductive connector having a second height, the second conductive connector having a third height, the third height being different than the second height. The package also includes a first dummy conductive connector being between the first side of the interposer and the first die package. The package also includes an underfill disposed beneath the first integrated circuit device and the first die package. The package also includes an encapsulant disposed around the first integrated circuit device and the first die package.

Embodiments may include one or more of the following features. The package where the first die package includes a first die connected to a second die by metal-to-metal bonding and dielectric-to-dielectric bonding, a first dielectric material over the first die and the second die, where the first dielectric material surrounds the first die, and a first through via extending through the first dielectric material, where the first through via is connected to the first die. The first die package further includes a second through via extending through the first dielectric material, where the second through via is connected to the second die. The first die package further includes a third through via extending through the first dielectric material, where the third through via is connected to the second die. A footprint of the first die package on the first side of the interposer includes a first area, a second area, and a third area, the first conductive connector and the first dummy conductive connector being in the first area, the second conductive connector being in the second area, the second height being less than the third height. The second area surrounds the first area. The first area surrounds the second area. The second area includes a second dummy conductive connector, and the third area is free of dummy conductive connectors. The package further including a third conductive connector in the second area, the third conductive connector having a greater height than the second height, and a fourth conductive connector in the third area, the fourth conductive connector having a greater height than the third conductive connector.

In an embodiment, forming a first redistribution structure on a first side of an interposer, the first redistribution structure including metal lines and vias in dielectric layers, the first redistribution structure including active pads and dummy pads on a first surface of the first redistribution structure, the active pads being electrically coupled to the metal lines and vias, the dummy pads being electrically isolated from the metal lines and vias. The method also includes forming active connectors on the active pads. The method also includes forming dummy connectors on the dummy pads. The method also includes attaching a first integrated circuit device to a first subset of the active connectors. The method also includes attaching a second integrated circuit device to a second subset of the active connectors, the dummy connectors being between the interposer and the second integrated circuit device. The method also includes forming an underfill on the first side of the interposer, the underfill having a first portion beneath the first integrated circuit device and a second portion beneath the second integrated circuit device. The method also includes encapsulating the first integrated circuit device and the second integrated circuit device with an encapsulant.

Embodiments may include one or more of the following features. The method further including forming the second integrated circuit device, the forming including bonding a first die to a second die by metal-to-metal bonding and dielectric-to-dielectric bonding, forming a first dielectric material over the first die and the second die, the first dielectric material surrounding the first die, and forming a first through via extending through the first dielectric material, the first through via being connected to the first die. A footprint of the second integrated circuit device on the first redistribution structure includes a first area, a second area, and a third area, the first and second areas including dummy connectors, the first, second, and third areas including active connectors, the third area being free of dummy connectors. The active connectors in the third area are taller than the active connectors in the first and second areas. The active and dummy connectors in the first area have a first pattern density, the active connectors in the third area has a second pattern density, the second pattern density being less than the first pattern density. The second area surrounds the first area, and where the second area separates the first area from the third area. The first subset of the active connectors has a same height, and where the second subset of the active connectors have multiple heights. The method further including forming through vias extending through a substrate of the interposer, the first redistribution structure being electrically coupled to the through vias.

In an embodiment, attaching a first integrated circuit device to a first side of an interposer with a first set of connectors, the first set of connecters having a same height. The method also includes attaching a die package to the first side of the interposer with a second set of connectors, the second set of connectors having multiple heights, a first set of dummy connectors being between the interposer and the die package, the first set of dummy connectors being electrically isolated from the die package and the first integrated circuit device. The method also includes forming an underfill on the first side of the interposer beneath the first integrated circuit device and the die package. The method also includes encapsulating the first integrated circuit device and the die package with an encapsulant.

Embodiments may include one or more of the following features. The method where a footprint of the die package on the first side of the interposer includes a first area, a second area, and a third area, the second area surrounding the first area, the second area being between the first area and the third area, the first and second areas including the first set of dummy connectors, the first, second, and third areas including active connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   an interposer having a first side;
   a first integrated circuit device attached to the first side of the interposer with a first set of conductive connectors, each of the first set of conductive connectors having a first height;
   a first die package attached to the first side of the interposer with a second set of conductive connectors, the second set of conductive connectors including a first conductive connector and a second conductive connector, the first conductive connector having a second height, the second conductive connector having a third height, the third height being different than the second height;
   a first dummy conductive connector being between the first side of the interposer and the first die package, the first dummy conductive connector being between the first conductive connector and the second conductive connector;
   an underfill disposed beneath the first integrated circuit device and the first die package; and
   an encapsulant disposed around the first integrated circuit device and the first die package.

2. The package of claim 1, wherein the first die package comprises:
   a first die connected to a second die by metal-to-metal bonding and dielectric-to-dielectric bonding;
   a first dielectric material over the first die and the second die, wherein the first dielectric material surrounds the first die; and
   a first through via extending through the first dielectric material, wherein the first through via is connected to the first die.

3. The package of claim 2, wherein the first die package further comprises a second through via extending through the first dielectric material, wherein the second through via is connected to the second die.

4. The package of claim 2, wherein the first die package further comprises a third through via extending through the first dielectric material, wherein the third through via is connected to the second die.

5. The package of claim 1, wherein a footprint of the first die package on the first side of the interposer comprises a first area, a second area, and a third area, the first conductive connector and the first dummy conductive connector being in the first area, the second conductive connector being in the second area, the second height being less than the third height.

6. The package of claim 5, wherein the second area surrounds the first area.

7. The package of claim 5, wherein the first area surrounds the second area.

8. The package of claim 5, wherein the second area includes a second dummy conductive connector, and the third area is free of dummy conductive connectors.

9. The package of claim 8 further comprising:
   a third conductive connector in the second area, the third conductive connector having a greater height than the second height; and
   a fourth conductive connector in the third area, the fourth conductive connector having a greater height than the third conductive connector.

10. The package of claim 1, wherein the underfill separates the first dummy conductive connector from the first die package.

11. A structure comprising:
    a first redistribution structure on a first side of an interposer, the first redistribution structure comprising metal lines and vias in dielectric layers, the first redistribution structure comprising active pads and dummy pads on a first surface of the first redistribution structure, the active pads being electrically coupled to the metal lines and vias, the dummy pads being electrically isolated from the metal lines and vias;
    a first integrated circuit device bonded to a first subset of the active pads with active connectors;
    a second integrated circuit device bonded to a second subset of the active pads with active connectors;
    dummy connectors on the dummy pads, the dummy connectors being between the interposer and the second integrated circuit device;
    an underfill on the first side of the interposer, the underfill having a first portion beneath the first integrated circuit device and a second portion beneath the second integrated circuit device; and
    an encapsulant around the first integrated circuit device and the second integrated circuit device.

12. The structure of claim 11, wherein the second integrated circuit device comprises:
    a first die bonded to a second die by metal-to-metal bonds and dielectric-to-dielectric bonds;
    a first dielectric material over the first die and the second die, the first dielectric material surrounding the first die; and
    a first through via extending through the first dielectric material, the first through via being connected to the first die.

13. The structure of claim 11, wherein a footprint of the second integrated circuit device on the first redistribution structure comprises a first area, a second area, and a third area, the first and second areas comprising dummy connectors, the first, second, and third areas comprising active connectors, the third area being free of dummy connectors.

14. The structure of claim 13, wherein the active connectors in the third area are taller than the active connectors in the first and second areas.

15. The structure of claim 13, wherein the active and dummy connectors in the first area have a first pattern density, the active connectors in the third area have a second pattern density, the second pattern density being less than the first pattern density.

16. The structure of claim 13, wherein the second area surrounds the first area, and wherein the second area separates the first area from the third area.

17. The structure of claim 11, wherein the first subset of the active connectors has a same height, and wherein the second subset of the active connectors has multiple heights.

18. The structure of claim 11 further comprising:
    through vias extending through a substrate of the interposer, the first redistribution structure being electrically coupled to the through vias.

19. A package comprising:
    a first integrated circuit device attached to a first side of an interposer with a first set of connectors, the first set of connectors having a same height;
    a die package attached to the first side of the interposer with a second set of connectors, the second set of connectors having multiple heights, a first set of dummy connectors being between the interposer and the die package, the first set of dummy connectors being electrically isolated from the die package and the first integrated circuit device, at least one of the first set of dummy connectors being between connectors of the second set of connectors;

an underfill on the first side of the interposer beneath the first integrated circuit device and the die package; and an encapsulant surrounding the first integrated circuit device and the die package.

20. The package of claim 19, wherein a footprint of the die package on the first side of the interposer comprises a first area, a second area, and a third area, the second area surrounding the first area, the second area being between the first area and the third area, the first and second areas comprising the first set of dummy connectors, the first, second, and third areas comprising active connectors.

* * * * *